(12) United States Patent
Kang et al.

(10) Patent No.: US 11,450,761 B2
(45) Date of Patent: Sep. 20, 2022

(54) SEMICONDUCTOR DEVICE

(71) Applicant: Samsung Electronics Co., Ltd., Suwon-si (KR)

(72) Inventors: Myung Gil Kang, Suwon-si (KR); Dongwon Kim, Seongnam-si (KR); Minyi Kim, Hwaseong-si (KR); Keun Hwi Cho, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 18 days.

(21) Appl. No.: 16/857,621

(22) Filed: Apr. 24, 2020

(65) Prior Publication Data
US 2021/0091211 A1 Mar. 25, 2021

(30) Foreign Application Priority Data
Sep. 20, 2019 (KR) .................. 10-2019-0116040

(51) Int. Cl.
*H01L 29/66* (2006.01)
*H01L 29/732* (2006.01)
(Continued)

(52) U.S. Cl.
CPC ...... *H01L 29/732* (2013.01); *H01L 21/82285* (2013.01); *H01L 21/823821* (2013.01);
(Continued)

(58) Field of Classification Search
CPC . H01L 29/732; H01L 29/063; H01L 29/6656; H01L 29/0649; H01L 29/735; H01L 29/0847; H01L 29/0673; H01L 29/0804–0834; H01L 29/775; H01L 29/66439; H01L 29/78696; H01L 29/41708; H01L 29/42304; H01L 29/42392; H01L 29/36; H01L 29/8249; H01L 27/0623; H01L 27/0823; H01L 27/0886; H01L 27/0924; H01L 27/10879; H01L 21/76897; H01L 21/823493; H01L 21/823475; H01L 21/823468; H01L 21/82285; H01L 21/823821; H01L 29/0821; H01L 29/785; H01L 29/41791;
(Continued)

(56) References Cited

U.S. PATENT DOCUMENTS 5,885,880 A  3/1999 Gomi
6,284,581 B1  9/2001 Pan et al.
(Continued)

*Primary Examiner* — Natalia A Gondarenko
(74) *Attorney, Agent, or Firm* — Harness, Dickey & Pierce, P.L.C.

(57) ABSTRACT

A semiconductor device including a well region in a substrate, an impurity region in the well region, a first active fin on the impurity region, a second active fin on the well region, and a connection pattern penetrating the second active fin and connected to the well region may be provided. The substrate and the impurity region include impurities having a first conductivity type. The well region includes impurities having a second conductivity type different from the first conductivity type. The first active fin includes a plurality of first semiconductor patterns that are spaced apart from each other in a direction perpendicular to a top surface of the substrate. The first semiconductor patterns and the impurity region include impurities having the first conductivity type.

20 Claims, 39 Drawing Sheets

(51) Int. Cl.
*H01L 29/735* (2006.01)
*H01L 21/8228* (2006.01)
*H01L 21/8238* (2006.01)
*H01L 29/06* (2006.01)

(52) U.S. Cl.
CPC ........ *H01L 29/063* (2013.01); *H01L 29/0649* (2013.01); *H01L 29/6656* (2013.01); *H01L 29/735* (2013.01)

(58) Field of Classification Search
CPC ........... H01L 29/66795; H01L 29/6625; H01L 29/0665; H01L 29/0808; H01L 29/1008; H01L 27/0207; H01L 27/0883; H01L 27/0922; H01L 21/26586; H01L 21/308; H01L 21/324; H01L 21/76895; H01L 21/823431; B82Y 10/00
USPC .......... 257/133, 368, 565, 306, 586, 29.198, 257/21.383, 27.015
See application file for complete search history.

(56) References Cited

U.S. PATENT DOCUMENTS

| | | | |
|---|---|---|---|
| 6,333,237 | B1 | 12/2001 | Yoshida |
| 7,518,195 | B2* | 4/2009 | Ernst .................. H01L 29/42384 257/347 |
| 7,732,834 | B2 | 6/2010 | Russ et al. |
| 10,243,040 | B1 | 3/2019 | Park et al. |
| 10,290,626 | B1 | 5/2019 | Li et al. |
| 2005/0169096 | A1* | 8/2005 | Lee .................. H01L 21/32134 257/E21.309 |
| 2010/0059807 | A1* | 3/2010 | Cho ...................... H01L 29/785 257/306 |
| 2012/0299114 | A1 | 11/2012 | Otake |
| 2017/0062564 | A1* | 3/2017 | Zhou .................. H01L 29/0684 |
| 2020/0105889 | A1* | 4/2020 | Liaw .................. H01L 29/0673 |

* cited by examiner

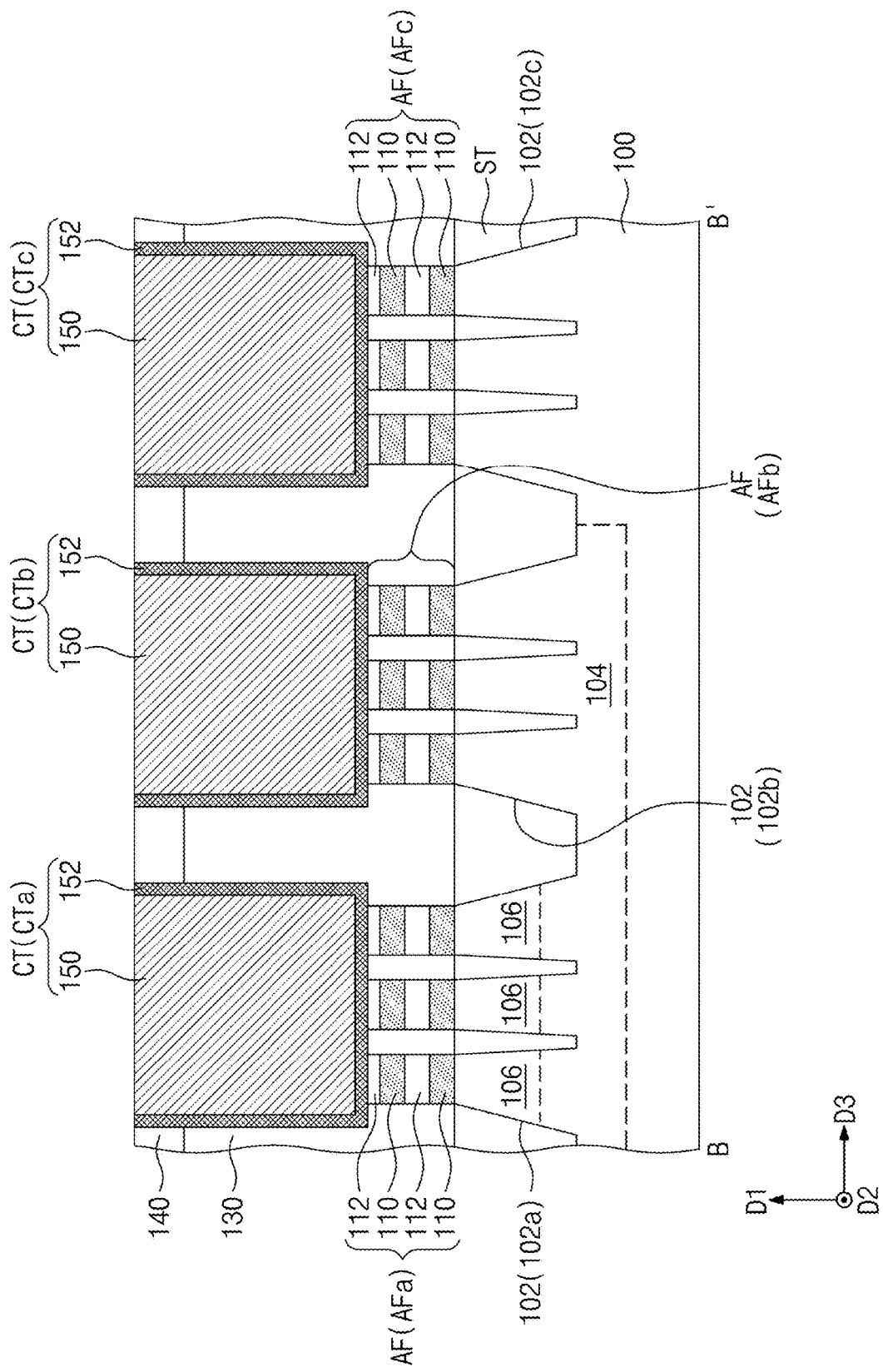

SEMICONDUCTOR DEVICE

CROSS-REFERENCE TO RELATED APPLICATION

This U.S. nonprovisional application claims priority under 35 U.S.C § 119 to Korean Patent Application No. 10-2019-0116040 filed on Sep. 20, 2019, in the Korean Intellectual Property Office, the disclosures of which are hereby incorporated by reference in their entirety.

BACKGROUND

Inventive concepts relate to semiconductor devices, and more particularly, to semiconductor devices including a vertical bipolar junction transistor.

A semiconductor device includes an integrated circuit consisting of metal oxide semiconductor field effect transistors (MOSFETs). As size and design rule of the semiconductor device are gradually decreased, sizes of the MOSFETs are also increasingly scaled down. The scale down of MOSFETs may deteriorate operating characteristics of the semiconductor device. Accordingly, research has been variously developed to manufacture the semiconductor device having excellent performances while overcoming limitations due to integration of the semiconductor device. For example, multi-bridge channel field effect transistors that use three-dimensional channels have been used to achieve high integration of semiconductor devices, and furthermore, bipolar junction transistors have been suggested which are compatible with the multi-bridge channel field effect transistors.

SUMMARY

Some example embodiments of inventive concepts provide semiconductor devices including a vertical bipolar junction transistor with improved electrical characteristics.

Some example embodiments of inventive concepts provide semiconductor devices including a vertical bipolar junction transistor whose structure is easily compatible with those of multi-bridge channel field effect transistors.

According to some example embodiments of inventive concepts, a semiconductor device may include a well region in a substrate, an impurity region in the well region, a first active fin on the impurity region, a second active fin on the well region, and a connection pattern penetrating the second active fin and connected to the well region. The substrate and the impurity region may include impurities having a first conductivity type. The well region may include impurities having a second conductivity type different from the first conductivity type. The first active fin may include a plurality of first semiconductor patterns that are spaced apart from each other in a direction perpendicular to a top surface of the substrate. The first semiconductor patterns and the impurity region may include impurities having the first conductivity type.

According to some example embodiments of inventive concepts, a semiconductor device may include a well region in a substrate, an impurity region in the well region, a first active fin on the impurity region and including a plurality of first semiconductor patterns, the first semiconductor patterns being spaced apart from each other in a first direction perpendicular to a top surface of the substrate, a second active fin on the well region and including a plurality of second semiconductor patterns, the second semiconductor patterns being spaced apart from each other in the first direction, a third active fin on the substrate and including a plurality of third semiconductor patterns, the third semiconductor patterns being spaced apart from each other in the first direction, a first connection pattern penetrating the second active fin and connected to the well region, and a second connection pattern penetrating the third active fin and connected to the substrate. The substrate, the impurity region, and the first semiconductor patterns may include impurities having a first conductivity type. The well region may include impurities having a second conductivity type different from the first conductivity type.

According to some example embodiments of inventive concepts, a semiconductor device may include a well region in a substrate, an impurity region in the well region, a first active fin on the impurity region, the first active fin including a plurality of first semiconductor patterns and a plurality of first sacrificial patterns that are alternately stacked in a first direction perpendicular to a top surface of the substrate, a plurality of first contact plugs on the first active fin, and an interlayer dielectric layer covering the first active fin and surrounding the first contact plugs. The substrate, the impurity region, the first semiconductor patterns, and the first sacrificial patterns may include impurities having a first conductivity type. The well region may include impurities having a second conductivity type different from the first conductivity type. The interlayer dielectric layer may extend between the first contact plugs and may contact the first active fin.

BRIEF DESCRIPTION OF THE DRAWINGS

FIGS. 3A to 8A and 3B to 8B illustrate cross-sectional views taken along lines A-A' and B-B' of FIG. 1, respectively, showing a method of fabricating a semiconductor device according to some example embodiments of inventive concepts.

FIGS. 24A to 26A and 24B to 26B illustrate cross-sectional views taken along lines A-A' and B-B' of FIG. 17, respectively, showing a method of fabricating a semiconductor device according to some example embodiments of inventive concepts.

FIGS. 27A and 27B illustrate cross-sectional views taken along lines A-A' and B-B' of FIG. 1, respectively, showing a semiconductor device according to some example embodiments of inventive concepts.

DETAILED DESCRIPTION

Some example embodiments of inventive concepts will be described below in detail in conjunction with the accompanying drawings to aid in clearly understanding the present inventive concepts.

When the terms "about" or "substantially" are used in this specification in connection with a numerical value, it is intended that the associated numerical value includes a manufacturing tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Figure 1:
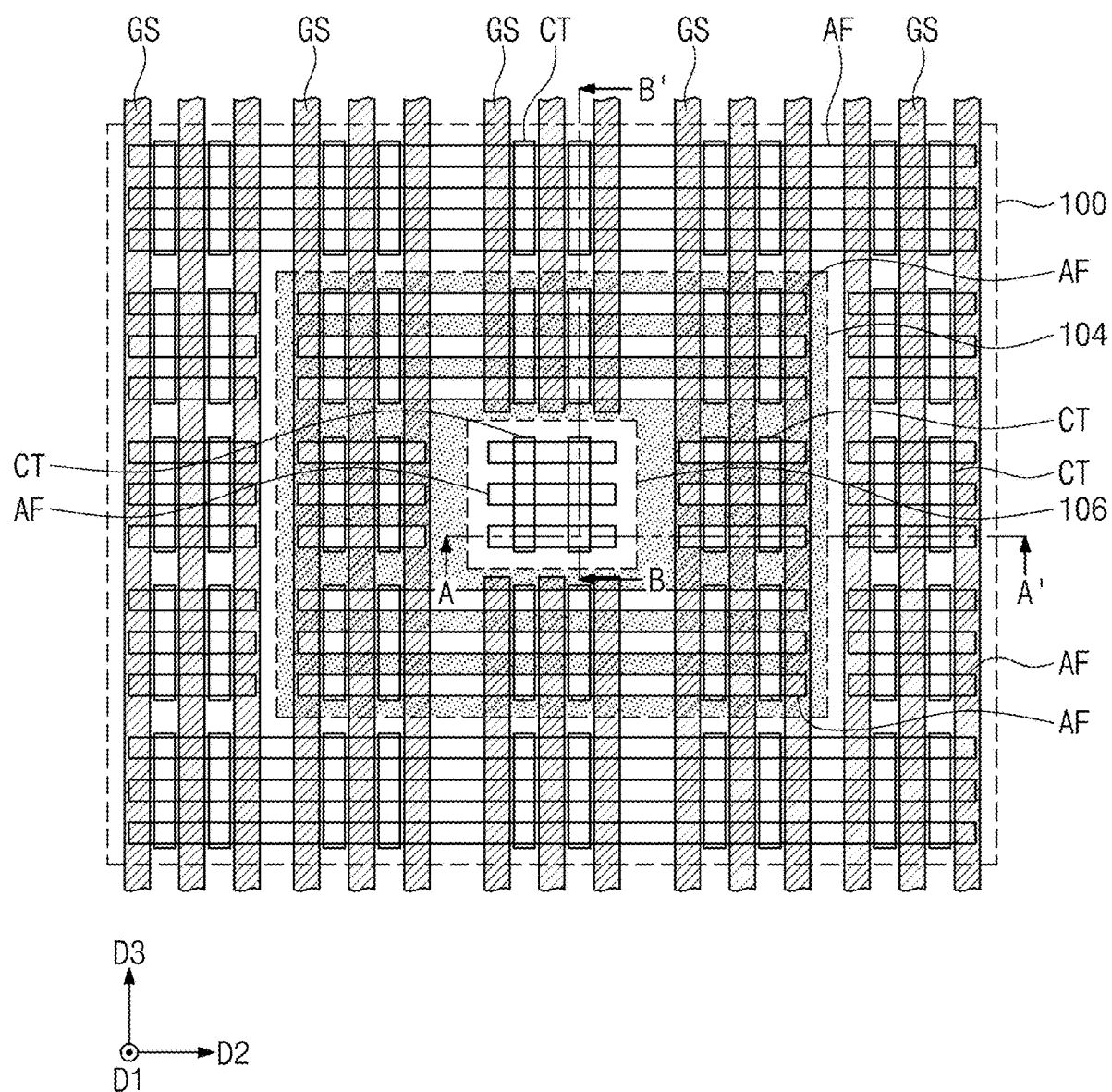
FIG. 1 illustrates a plan view showing a semiconductor device according to some example embodiments of inventive concepts.
Figure 2A:
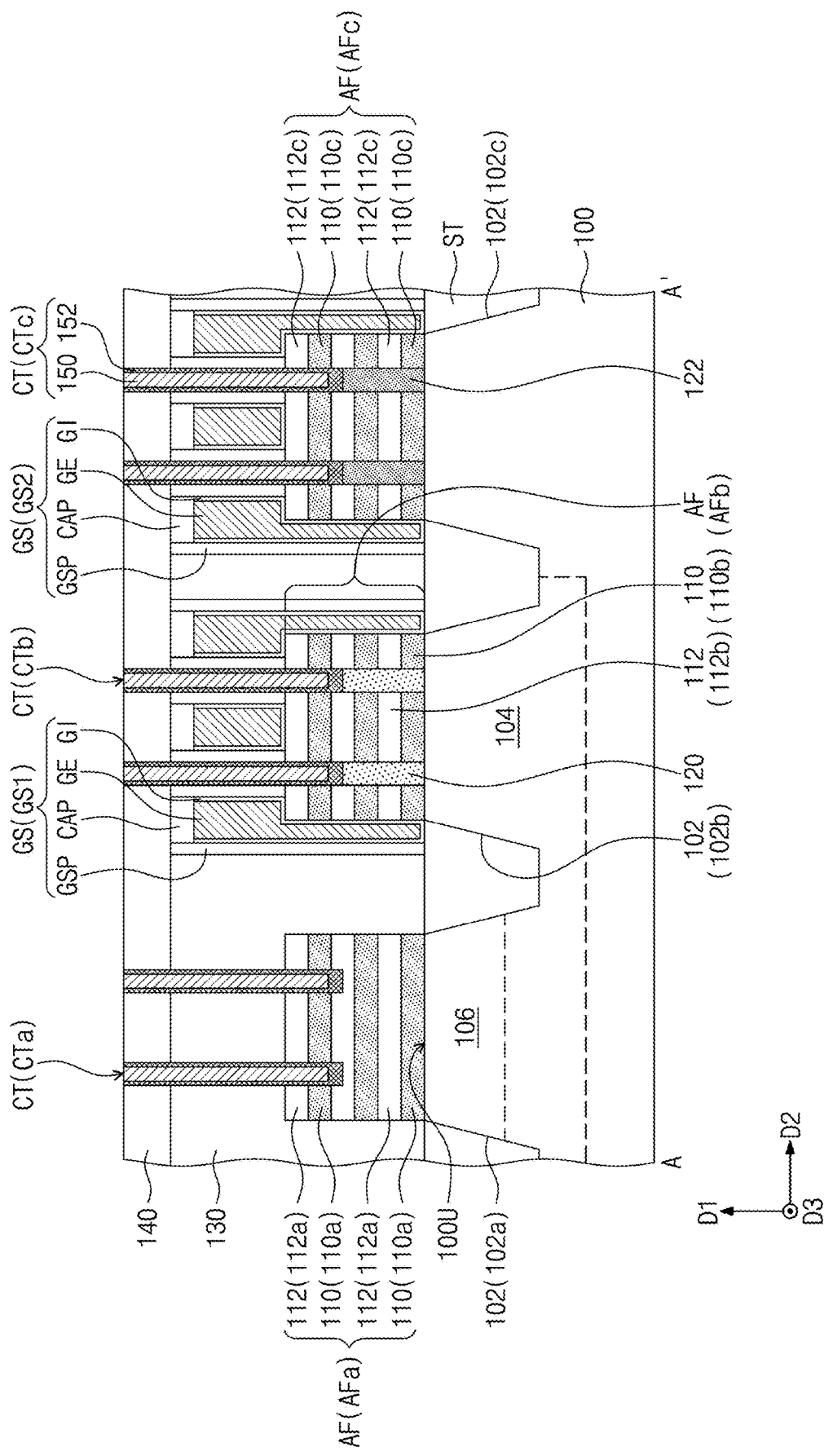
FIGS. 2A and 2B illustrate cross-sectional views taken along lines A-A' and B-B' of FIG. 1, respectively.
Figure 2B:
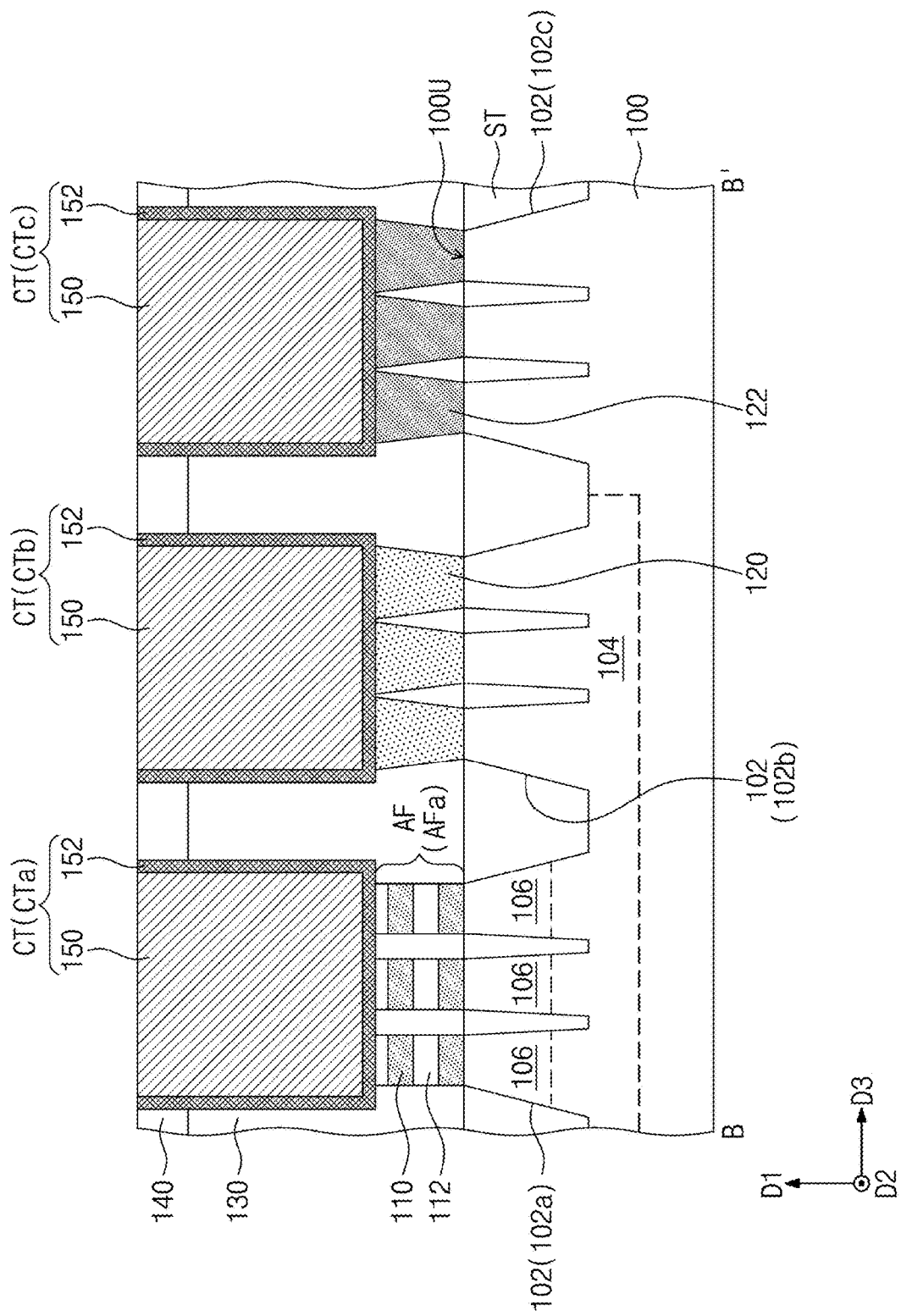

FIG. 1 illustrates a plan view showing a semiconductor device according to some example embodiments of inventive concepts. FIGS. 2A and 2B illustrate cross-sectional views taken along lines A-A' and B-B' of FIG. 1, respectively.

Referring to FIGS. 1, 2A, and 2B, a well region 104 may be disposed in a substrate 100. The substrate 100 may be a semiconductor substrate, for example, a silicon substrate or a silicon-on-insulator (SOI) substrate. The substrate 100 may have a first conductivity type, and the well region 104 may have a second conductivity type different from the first conductivity type. For example, the first conductivity type may be P-type, and the second conductivity type may be N-type. An impurity region 106 may be disposed in the well region 104. The impurity region 106 may have the same conductivity type as that of the substrate 100. For example, the impurity region 106 may include impurities having the first conductivity type.

Device isolation patterns ST may be disposed in the substrate 100. The substrate 100 may include active patterns 102 defined by the device isolation patterns ST. The active patterns 102 may protrude from the substrate 100 or may include a protruded portion of the substrate 100 along a first direction D1 perpendicular to a top surface 100U of the substrate 100. Each of the device isolation patterns ST may be interposed between corresponding ones of the active patterns 102. The device isolation patterns ST may include oxide, nitride, and/or oxynitride.

The active patterns 102 may include a first active pattern 102a, a second active pattern 102b, and a third active pattern 102c that are spaced apart from each other in a second direction D2 parallel to the top surface 100U of the substrate 100. The first active pattern 102a may include the impurity region 106, and the second active pattern 102b may include the well region 104. The third active pattern 102c may be a portion of the substrate 100. One of the device isolation patterns ST may be interposed between the first active pattern 102a and the second active pattern 102b. The well region 104 may extend along a bottom surface of the one of the device isolation patterns ST and extend toward a lower portion of the first active pattern 102a. Therefore, the impurity region 106 and the well region 104 may have therebetween a boundary that is disposed in the lower portion of the first active pattern 102a. The impurity region 106 and the well region 104 may constitute a PN junction at the lower portion of the first active pattern 102a. Another of the device isolation patterns ST may be interposed between the second active pattern 102b and the third active pattern 102c, and may be disposed on a boundary (e.g., a vertical boundary) between the well region 104 and the substrate 100. The well region 104 and the substrate 100 may constitute a PN junction below the device isolation patterns ST.

Active fins AF may be disposed on corresponding active patterns 102. In some example embodiments, each of the active fins AF may include sacrificial patterns 110 and semiconductor patterns 112 that are alternately stacked along the first direction D1 on one of the active patterns 102. The sacrificial patterns 110 may include a different material from that of the semiconductor patterns 112. For example, the semiconductor patterns 112 may include silicon (Si), and the sacrificial patterns 110 may include silicon-germanium (SiGe).

The active fins AF may include a first active fin AFa on the first active pattern 102a, a second active fin AFb on the second active pattern 102b, and a third active fin AFc on the third active pattern 102c. The semiconductor patterns 112 and the sacrificial patterns 110 of the first active fin AFa may be called first semiconductor patterns 112a and first sacrificial patterns 110a, and the semiconductor patterns 112 and the sacrificial patterns 110 of the second active fin AFb may be called second semiconductor patterns 112b and second sacrificial patterns 110b. The semiconductor patterns 112 and the sacrificial patterns 110 of the third active fin AFc may be called third semiconductor patterns 112c and third sacrificial patterns 110c. The first, second, and third semiconductor patterns 112a, 112b, and 112c may include the same material (e.g., silicon), and the first, second, and third sacrificial patterns 110a, 110b, and 110c may include the same material (e.g., silicon-germanium).

The first active fin AFa may include impurities having the first conductivity type. In some example embodiments, the first semiconductor patterns 112a and the first sacrificial patterns 110a may include impurities having the first conductivity type. A lowermost one of the first sacrificial patterns 110a may contact the impurity region 106.

A first connection pattern 120 may penetrate the second active fin AFb and be connected to the well region 104. In some example embodiments, the first connection pattern 120 may penetrate the second semiconductor patterns 112b and the second sacrificial patterns 110b, and may be connected to the well region 104. The first connection pattern 120 may be epitaxial patterns that are formed using the second semiconductor patterns 112b, the second sacrificial patterns 110b, and the second active pattern 102b as seeds. The first connection pattern 120 may include one or more of silicon-germanium (SiGe), silicon (Si), or silicon carbide (SiC). The first connection pattern 120 may further include impurities having the second conductivity type.

A second connection pattern 122 may penetrate the third active fin AFc and be connected to the substrate 100. In some example embodiments, the second connection pattern 122 may penetrate the third semiconductor patterns 112c and the third sacrificial patterns 110c, and may be connected to the substrate 100. The second connection pattern 122 may be epitaxial patterns that are formed using the third semiconductor patterns 112c, the third sacrificial patterns 110c, and the third active pattern 102c as seeds. The second connection pattern 122 may include one or more of silicon-germanium (SiGe), silicon (Si), or silicon carbide (SiC). The second connection pattern 122 may further include impurities having the first conductivity type.

The substrate 100 may be provided thereon with gate structures GS that run across the active fins AF. The gate structures GS may extend in a third direction D3 that is parallel to the top surface 100U of the substrate 100 and intersects the second direction D2. The gate structures GS may include first gate structures GS1 that run across the second active fin AFb and second gate structures GS2 that run across the third active fin AFc. The first gate structures GS1 may be spaced apart from each other in the second direction D2 on the second active fin AFb, and the second gate structures GS2 may be spaced apart from each other in the second direction D2 on the third active fin AFc. In some example embodiments, no gate structures GS may be disposed on the first active fin AFa.

Each of the gate structures GS may include a gate electrode GE that extends in the third direction D3 and runs across a corresponding active fin AF, a gate dielectric pattern GI between the gate electrode GE and the corresponding active fin AF, gate spacers GSP on lateral surfaces of the gate electrode GE, and a gate capping pattern CAP on a top surface of the gate electrode GE. Further, the gate dielectric pattern GI may extend between the gate electrode GE and the gate spacers GSP, and may have an uppermost top surface substantially coplanar with the top surface of the gate electrode GE. The gate spacers GSP may extend onto lateral surfaces of the gate capping pattern CAP. The gate electrode GE of each of the first gate structures GS1 may run across the second active fin AFb and may cover lateral surfaces of the second active fin AFb. The gate dielectric pattern GI of each of the first gate structures GS1 may be interposed between the gate electrode GE and the second active fin AFb. The gate electrode GE of each of the second gate structures GS1 may run across the third active fin AFc and may cover lateral surfaces of the third active fin AFc. The gate dielectric pattern GI of each of the second gate structures GS2 may be interposed between the gate electrode GE and the third active fin AFc.

The gate electrode GE may include a doped semiconductor, conductive metal nitride, and/or metal. The gate dielectric pattern GI may include one or more of a silicon oxide layer, a silicon nitride layer, a silicon oxynitride layer, or a high-k dielectric layer. The high-k dielectric layer may include a material (e.g., hafnium oxide (HfO), aluminum oxide (AlO), or tantalum oxide (TaO) whose dielectric constant is greater than that of a silicon oxide layer. The gate spacers GSP and the gate capping pattern CAP may each include one or more of a silicon oxide layer, a silicon nitride layer, or a silicon oxynitride layer.

The substrate 100 may be provided thereon with a lower interlayer dielectric layer 130 that covers the gate structures GS, the active fins AF, and the first and second connection patterns 120 and 122. The lower interlayer dielectric layer 130 may include one or more of a silicon oxide layer, a silicon nitride layer, a silicon oxynitride layer, or a low-k dielectric layer. The gate capping pattern CAP of each of the gate structures GS may have a top surface substantially coplanar with that of the lower interlayer dielectric layer 130. The gate spacers GSP of each of the gate structures GS may be interposed between the gate capping pattern CAP and the lower interlayer dielectric layer 130.

An upper interlayer dielectric layer 140 may be disposed on the lower interlayer dielectric layer 130. The upper interlayer dielectric layer 140 may include an oxide layer, a nitride layer, and/or an oxynitride layer. The upper interlayer dielectric layer 140 may cover the top surface of the gate capping pattern CAP of each of the gate structures GS.

Contact plugs CT may be disposed in the lower interlayer dielectric layer 130 and may extend into the upper interlayer dielectric layer 140. Each of the contact plugs CT may include a conductive pattern 150 that penetrates the upper interlayer dielectric layer 140 and extends into the lower interlayer dielectric layer 130, and also include a barrier pattern 152 that covers lateral and bottom surfaces of the conductive pattern 150. For example, the conductive pattern 150 may include metal, and the barrier pattern 152 may include conductive metal nitride.

The contact plugs CT may include a first contact plug CTa connected to the first active fin AFa, a second contact plug CTb connected to the first connection pattern 120, and a third contact plug CTc connected to the second connection pattern 122.

A plurality of first contact plugs CTa may be connected to the first active fin AFa. The lower interlayer dielectric layer 130 may be interposed between the plurality of first contact plugs CTa and in contact with a top surface of the first active fin AFa. The plurality of first contact plugs CTa may have their lateral surfaces in contact with the lower interlayer dielectric layer 130. In some example embodiments, a plurality of first active patterns 102a may be arranged spaced apart from each other in the third direction D3, and a plurality of first active fins AFa may be correspondingly disposed on the plurality of first active patterns 102a. In this case, the first contact plug CTa may extend in the third direction D3 and be connected to the plurality of first active fins AFa.

The second contact plug CTb may be interposed between the first gate structures GS1, and may penetrate the second active fin AFb and be connected to the first connection pattern 120. The second contact plug CTb may have lateral surfaces in contact with the gate spacers GSP of the first gate structures GS1. In some example embodiments, a plurality of second active patterns 102b may be arranged spaced apart from each other in the third direction D3, and a plurality of second active fins AFb may be correspondingly disposed on the plurality of second active patterns 102b, respectively. In this case, a plurality of first connection patterns 120 may correspondingly penetrate the plurality of second active fins AFb, respectively, and be connected to the well region 104. The second contact plug CTb may extend in the third direction D3 and be connected to the plurality of first connection patterns 120.

The third contact plug CTc may be interposed between the second gate structures GS2, and may penetrate the third active fin AFc and be connected to the second connection pattern 122. The third contact plug CTc may contact the gate spacers GSP of the second gate structures GS2. In some example embodiments, a plurality of third active patterns 102c may be arranged spaced apart from each other in the third direction D3, and a plurality of third active fins AFc may be correspondingly disposed on the plurality of third active patterns 102c, respectively. In this case, a plurality of second connection patterns 122 may correspondingly penetrate the plurality of third active fins AFc, respectively and be connected to the substrate 100. The third contact plug CTc may extend in the third direction D3 and be connected to the plurality of second connection patterns 122.

The impurity region 106, the first active pattern 102a, the first active fin AFa, and the first contact plug CTa may constitute an emitter of a vertical bipolar junction transistor.

The well region 104, the second active pattern 102b, the second active fin AFb, the first connection pattern 120, the first gate structures GS1, and the second contact plug CTb may constitute a base of the vertical bipolar junction transistor. The substrate 100, the third active pattern 102c, the third active fin AFc, the second connection pattern 122, the second gate structures GS2, and the third contact plug CTc may constitute a collector of the vertical bipolar junction transistor. The first and second gate structures GS1 and GS2 may be dummy gate structures that are electrically floated.

According to the present example embodiment, the first active fin AFa and the impurity region 106 may include impurities having the first conductivity type, the well region 104 may include impurities having the second conductivity type, and thus the impurity region 106 and the well region 104 may constitute a PN junction at the lower portion of the first active pattern 102a. The well region 104 and the substrate 100 including impurities having the first conductivity type may constitute a PN junction below the device isolation patterns ST. In this case, because a PNP junction of the vertical bipolar junction transistor is formed adjacent to lower portions of the device isolation patterns ST or under the device isolation patterns ST, junction leakage may be minimized.

Further, each of the first, second, and third active fins AFa, AFb, and AFc may include the semiconductor patterns 112 that are spaced apart from each other in the first direction D1 perpendicular to the top surface 100U of the substrate 100. In this case, because each of the first, second, and third active fins AFa, AFb, and AFc has a structure same as or substantially similar to that of a channel of a multi-bridge channel field effect transistor, the vertical bipolar junction transistor may have a structure that is compatible with those of the multi-bridge channel field effect transistors.

FIGS. 3A to 8A and 3B to 8B illustrate cross-sectional views taken along lines A-A' and B-B' of FIG. 1, respectively, showing a method of fabricating a semiconductor device according to some example embodiments of inventive concepts. A description repetitive to that of the semiconductor device discussed with reference to FIGS. 1, 2A, and 2B will be omitted for brevity of explanation.

Figure 3A:
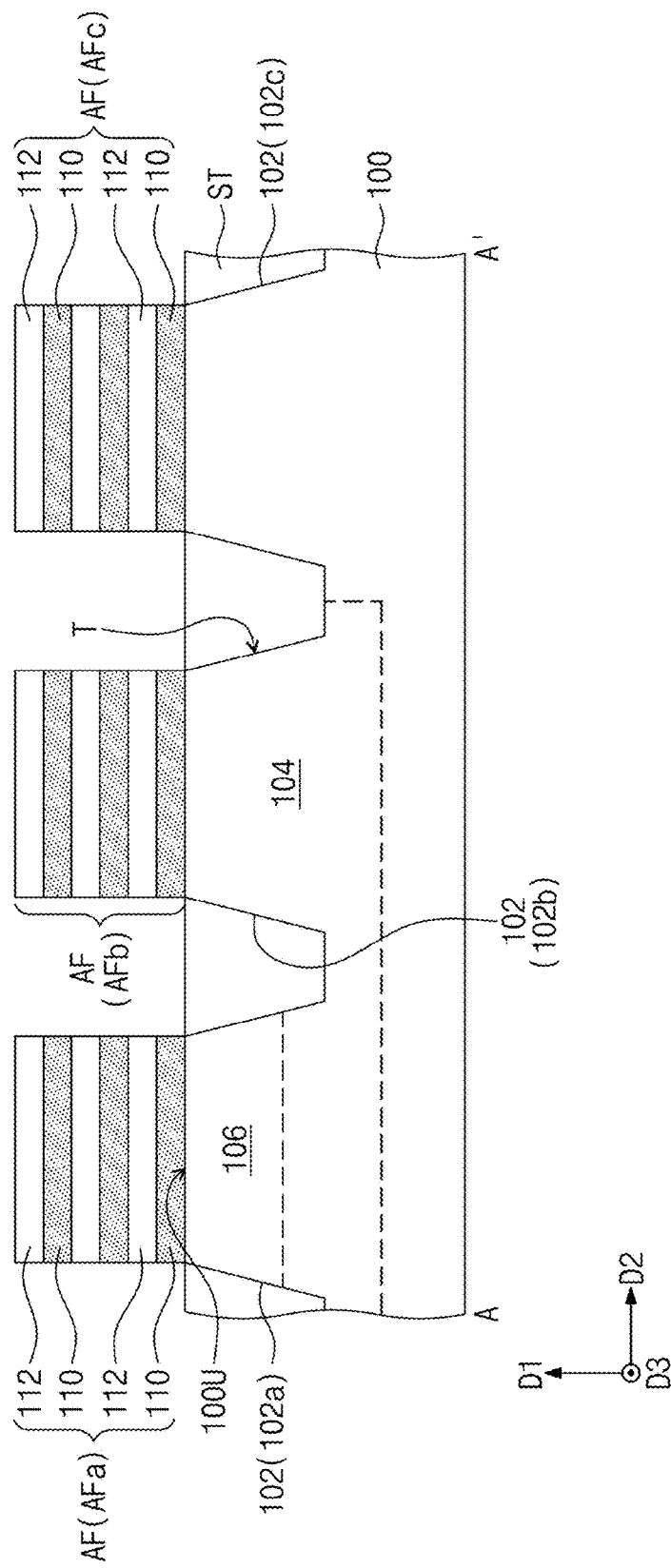
Figure 3B:
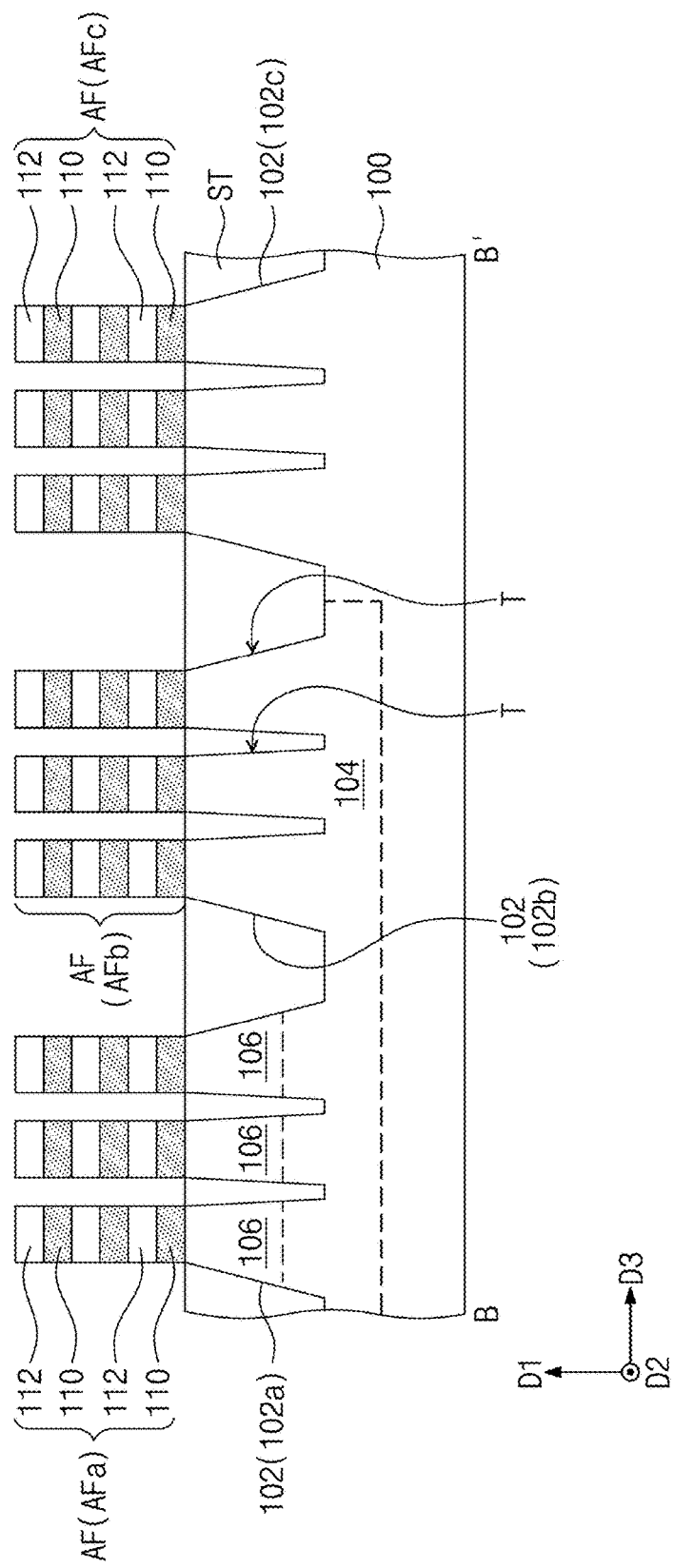

Referring to FIGS. 1, 3A, and 3B, a well region 104 may be formed in a substrate 100. The substrate 100 may have a first conductivity type, and the well region 104 may have a second conductivity type different from the first conductivity type. The well region 104 may be formed by implanting the substrate 100 with impurities having the second conductive type.

Active patterns 102 may be formed in the substrate 100, and active fins AF may be formed on corresponding active patterns 102. The formation of the active fins AF may include, for example, alternately and repeatedly stacking sacrificial layers and semiconductor layers on the substrate 100, and sequentially patterning the sacrificial layers and the semiconductor layers. Sacrificial patterns 110 and semiconductor patterns 112 may be formed by the patterning of the sacrificial layers and the semiconductor layers. Each of the active fins AF may include the sacrificial patterns 110 and the semiconductor patterns 112 that are alternately stacked on the substrate 100.

The formation of the active patterns 102 may include patterning an upper portion of the substrate 100 to form trenches T, which define the active patterns 102, in the substrate 100. The active patterns 102 may protrude from the substrate 100 or may include a protruded portion of the substrate 100, along a first direction D1 perpendicular to a top surface 100U of the substrate 100. The active patterns 102 may include a first active pattern 102a, a second active pattern 102b, and a third active pattern 102c that are spaced apart from each other in a second direction D2 parallel to the top surface 100U of the substrate 100. The first active pattern 102a and the second active pattern 102b may be formed on the well region 104, and the third active pattern 102c may be formed on the substrate 100 in which the well region 104 is not formed. The active fins AF may include a first active fin AFa on the first active pattern 102a, a second active fin AFb on the second active pattern 102b, and a third active fin AFc on the third active pattern 102c.

Device isolation patterns ST may be formed in the substrate 100. The formation of the device isolation patterns ST may include forming a dielectric layer that fills the trenches T and recessing the dielectric layer so as to expose the active fins AF. Because the dielectric layer is recessed, a top surface of each of the active fins AF and lateral surfaces (e.g., lateral surfaces of the sacrificial patterns 110 and lateral surfaces of the semiconductor patterns 112) of each of the active fins AF may be exposed.

An impurity region 106 may be formed in the first active pattern 102a. The formation of the impurity region 106 may include implanting the first active fin AFa and the first active pattern 102a with impurities having the first conductivity type. A boundary between the impurity region 106 and the well region 104 may be formed in a lower portion of the first active pattern 102a, and therefore the impurity region 106 and the well region 104 may constitute a PN junction at the lower portion of the first active pattern 102a. The well region 104 and the substrate 100 may constitute a PN junction below the device isolation patterns ST.

Figure 4A:
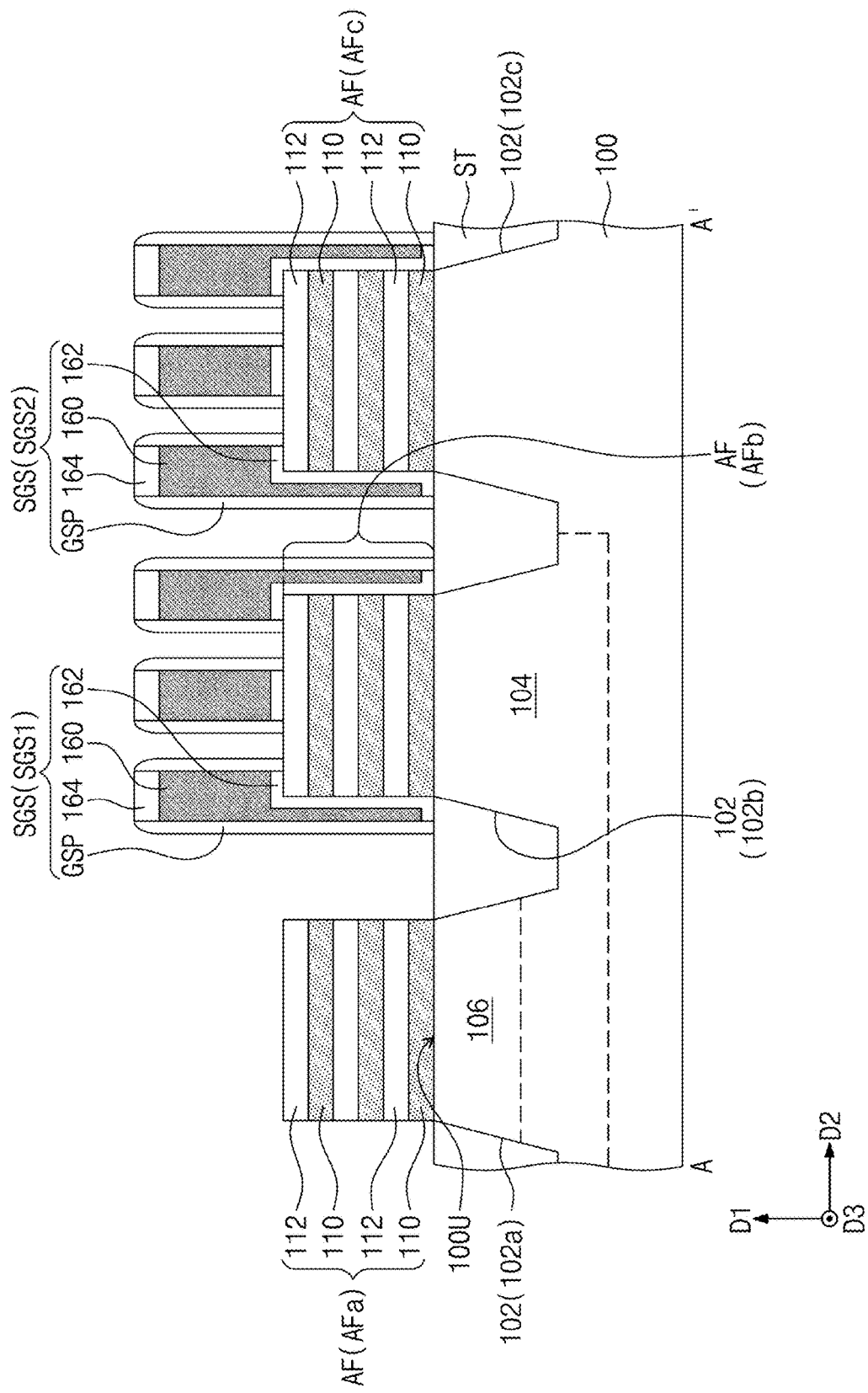
Figure 4B:
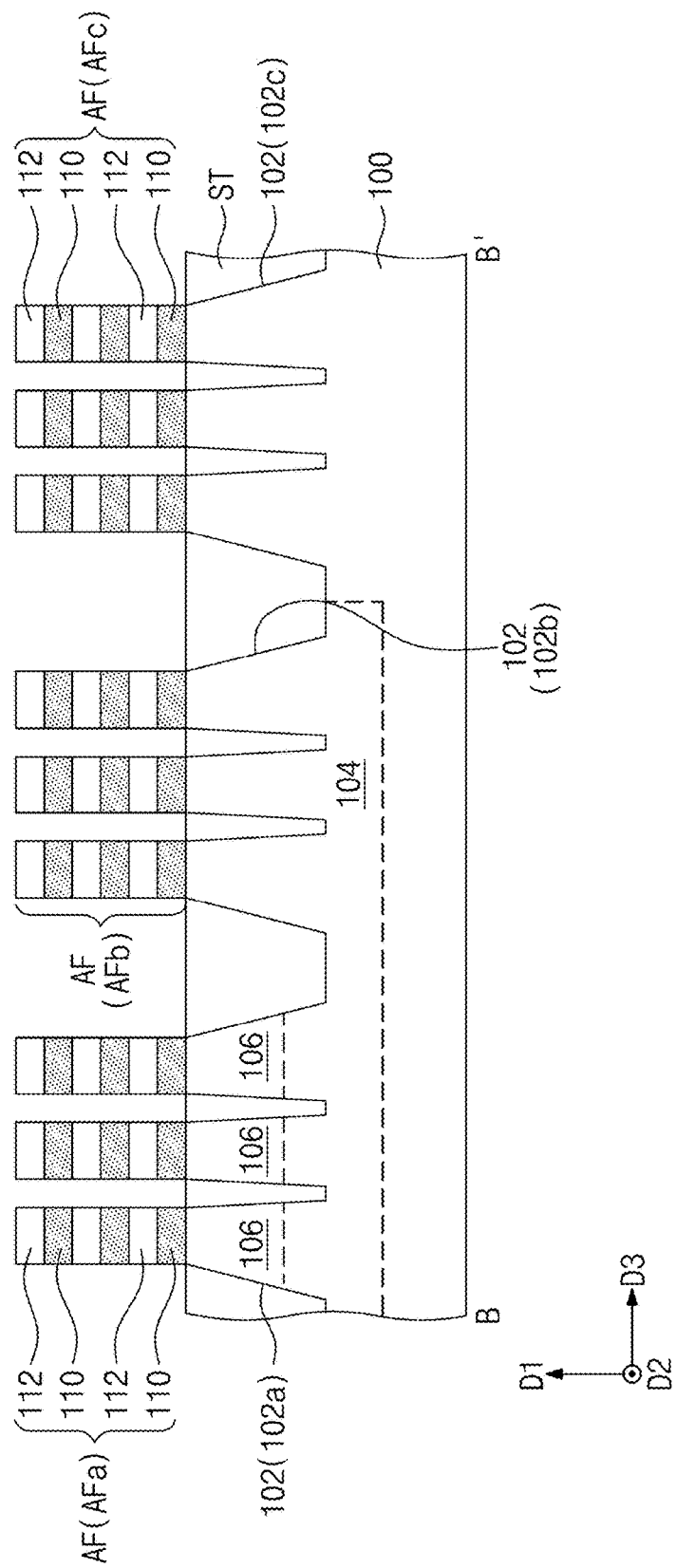

Referring to FIGS. 1, 4A, and 4B, on the substrate 100, sacrificial gate structures SGS may run across the active fins AF. The sacrificial gate structures SGS may extend in a third direction D3 that is parallel to the top surface 100U of the substrate 100 and intersects the second direction D2. The sacrificial gate structures SGS may include first sacrificial gate structures SGS1 that run across the second active fin AFb and second sacrificial gate structures SGS2 that run across the third active fin AFc. The first sacrificial gate structures SGS1 may be spaced apart from each other in the second direction D2 on the second active fin AFb, and the second sacrificial gate structures SGS2 may be spaced apart from each other on the third active fin AFc. In some example embodiments, the sacrificial gate structures SGS may not be formed on the first active fin AFa.

Each of the sacrificial gate structures SGS may include an etch stop pattern 162, a sacrificial gate pattern 160, and a gate mask pattern 164 that are sequentially stacked on the substrate 100. The sacrificial gate pattern 160 may extend in the third direction D3 and may have a linear shape (e.g., a line shape) that runs across a corresponding one of the active fins AF. The sacrificial gate pattern 160 may cover lateral surfaces of the corresponding active fin AF. The etch stop pattern 162 may be interposed between the sacrificial gate pattern 160 and the corresponding active fin AF, and the gate mask pattern 164 may extend along a top surface of the sacrificial gate pattern 160.

The formation of the sacrificial gate pattern 160 and the etch stop pattern 162 may include sequentially forming an etch stop layer (not shown) and a sacrificial gate layer (not shown) on the substrate 100, forming on the sacrificial gate layer the gate mask pattern 164 that defines an area where the sacrificial gate pattern 160 will be formed, and sequentially patterning the sacrificial gate layer and the etch stop layer using the gate mask pattern 164 as an etching mask. The etch stop layer may include, for example, a silicon oxide layer. The sacrificial gate layer may include a material having an etch selectivity with respect to the etch stop layer. The sacrificial gate layer may include, for example, polysilicon. The sacrificial gate pattern 160 may be formed by patterning the sacrificial gate layer using the gate mask pattern 164 as an etching mask. The patterning of the sacrificial gate layer may include performing an etching process that has an etch selectivity with respect to the etch stop layer. After the formation of the sacrificial gate pattern 160, the etch stop layer may be removed from opposite sides of the sacrificial gate pattern 160 such that the etch stop pattern 162 may be locally formed below the sacrificial gate pattern 160.

Each of the sacrificial gate structures SGS may further include gate spacers GSP on sidewalls of the sacrificial gate pattern 160. The formation of the gate spacers GSP may include forming on the substrate 100 a gate spacer layer that covers the gate mask pattern 164, the sacrificial gate pattern 160, and the etch stop pattern 162, and then anisotropically etching the gate spacer layer. The gate mask pattern 164 and the gate spacers GSP may include, for example, silicon nitride.

Figure 5A:
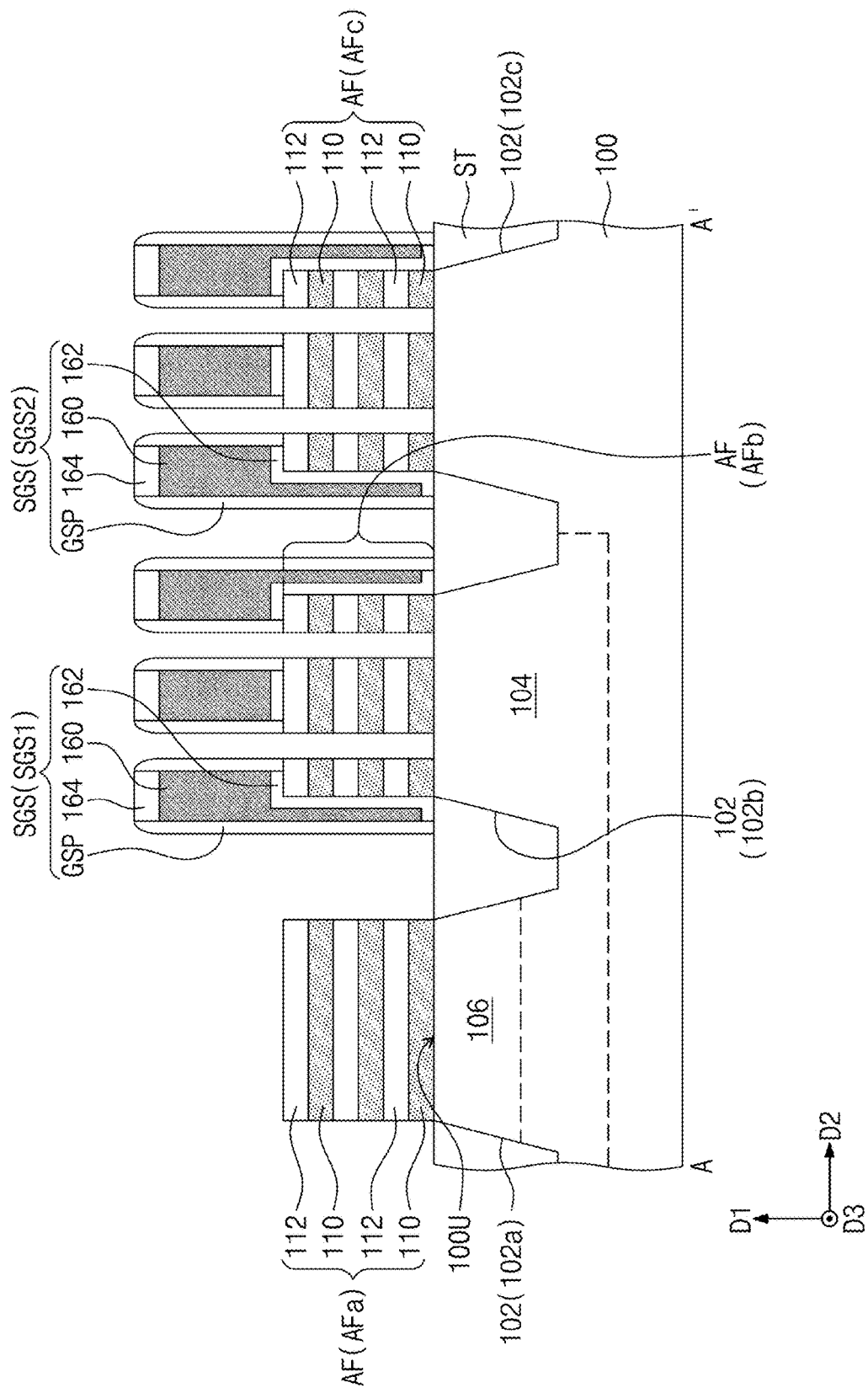
Figure 5B:
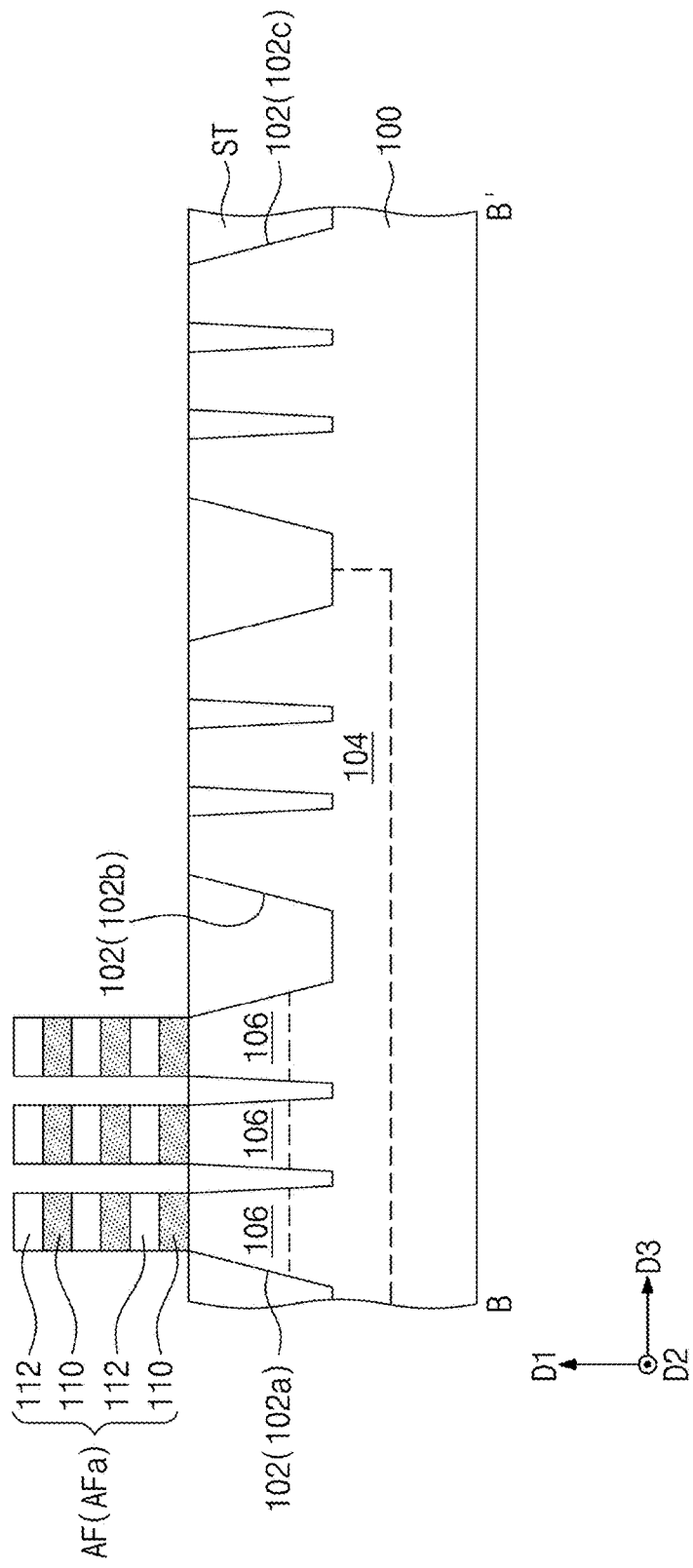

Referring to FIGS. 1, 5A, and 5B, the second active fin AFb may be partially removed between the first sacrificial gate structures SGS1 such that a top surface of the second active pattern 102b may be exposed between the first sacrificial gate structures SGS1. The third active fin AFc may be partially removed between the second sacrificial gate structures SGS2 such that a top surface of the third active pattern 102c may be exposed between the second sacrificial gate structures SGS2. During the removal of the portions of the second and third active fins AFb and AFc, a mask layer (not shown) may cover and protect the first active fin AFa.

Figure 6A:
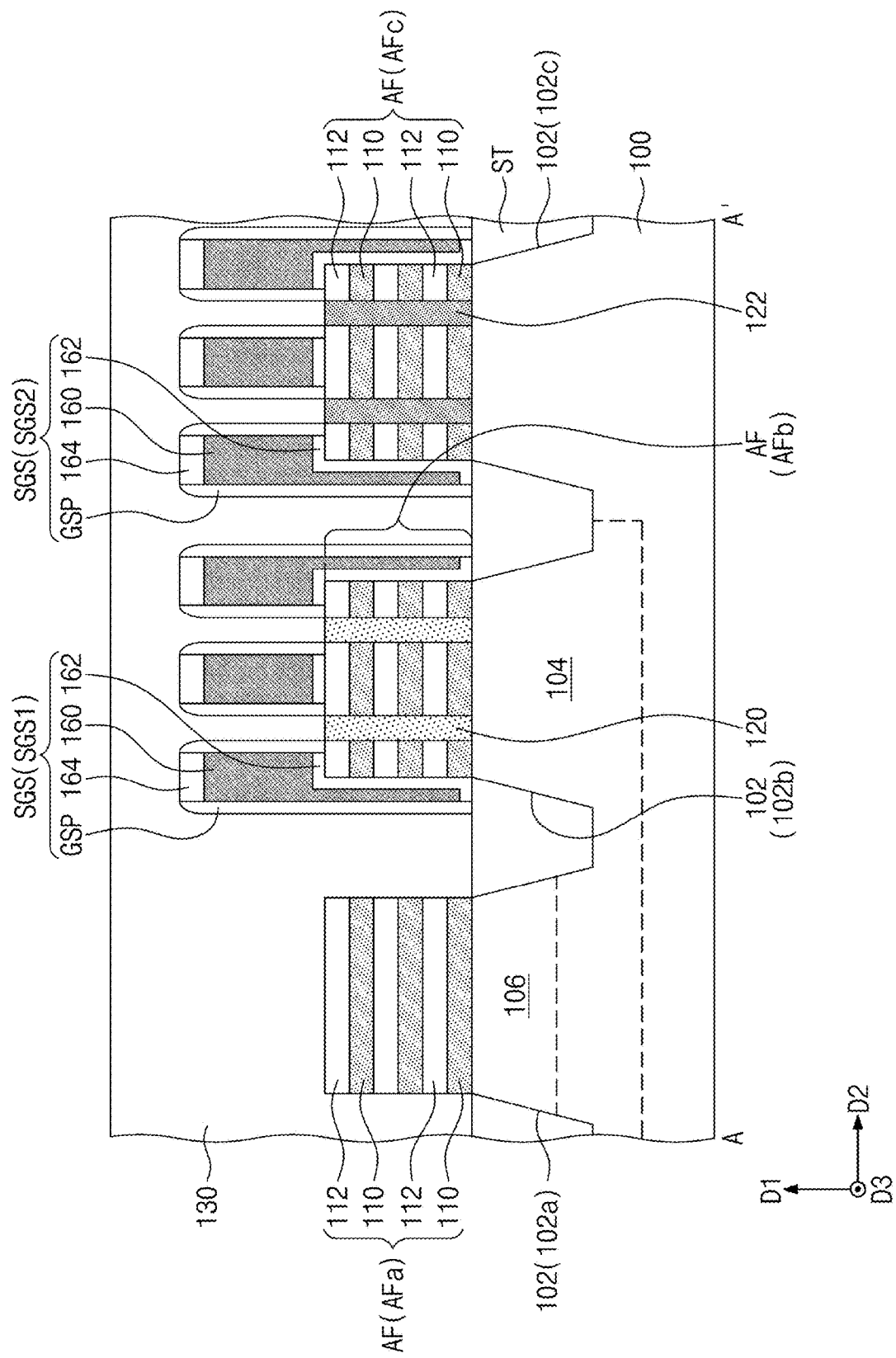
Figure 6B:
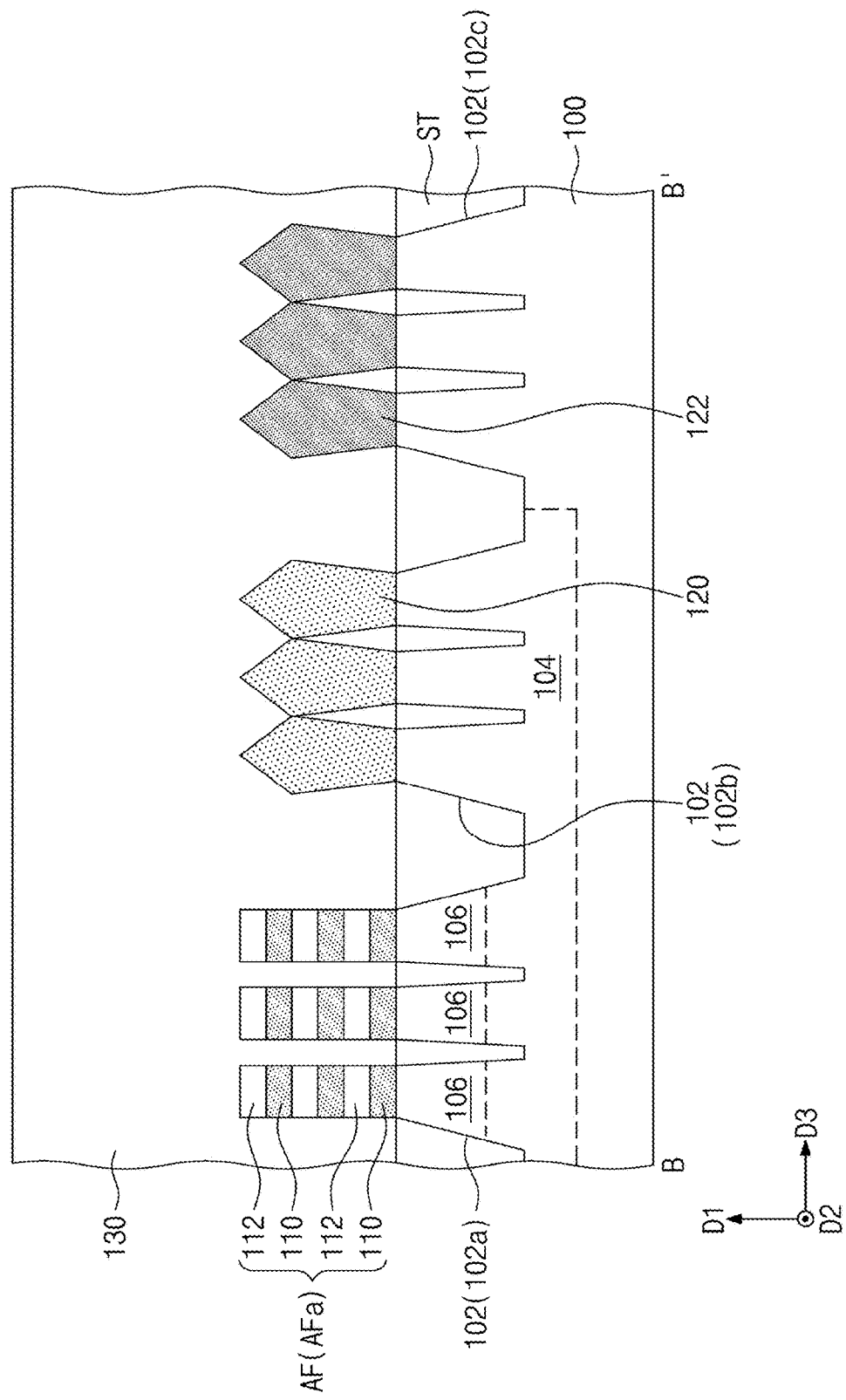

Referring to FIGS. 1, 6A, and 6B, a first connection pattern 120 may be formed on the second active pattern 102b between the first sacrificial gate structures SGS1. The first connection pattern 120 may be formed by performing a selective epitaxial growth process in which the semiconductor patterns 112 and the sacrificial patterns 110 of the second active fin AFb and the exposed top surface of the second active pattern 102b are used as seeds. The first connection pattern 120 may contact lateral surfaces of the semiconductor patterns 112 and the sacrificial patterns 110 of the second active fin AFb, and may be connected to the well region 104. Simultaneously with or after the selective epitaxial growth process, the formation of the first connection pattern 120 may further include implanting the first connection pattern 120 with impurities having the second conductivity type.

A second connection pattern 122 may be formed on the third active pattern 102c between the second sacrificial gate structures SGS2. The second connection pattern 122 may be formed by performing a selective epitaxial growth process in which the semiconductor patterns 112 and the sacrificial patterns 110 of the third active fin AFc and the exposed top surface of the third active pattern 102c are used as seeds. The second connection pattern 122 may contact lateral surfaces of the semiconductor patterns 112 and the sacrificial patterns 110 of the third active fin AFc, and may be connected to the substrate 100. Simultaneously with or after the selective epitaxial growth process, the formation of the second connection pattern 122 may further include implanting the second connection pattern 122 with impurities having the first conductivity type.

During the formation of the first and second connection patterns 120 and 122, the mask layer (not shown) may cover and protect the first active fin AFa. After the formation of the first and second connection patterns 120 and 122, the mask layer may be removed. Thereafter, on the substrate 100, a lower interlayer dielectric layer 130 may cover the active fins AF, the first and second connection patterns 120 and 122, and the sacrificial gate structures SGS.

Figure 7A:
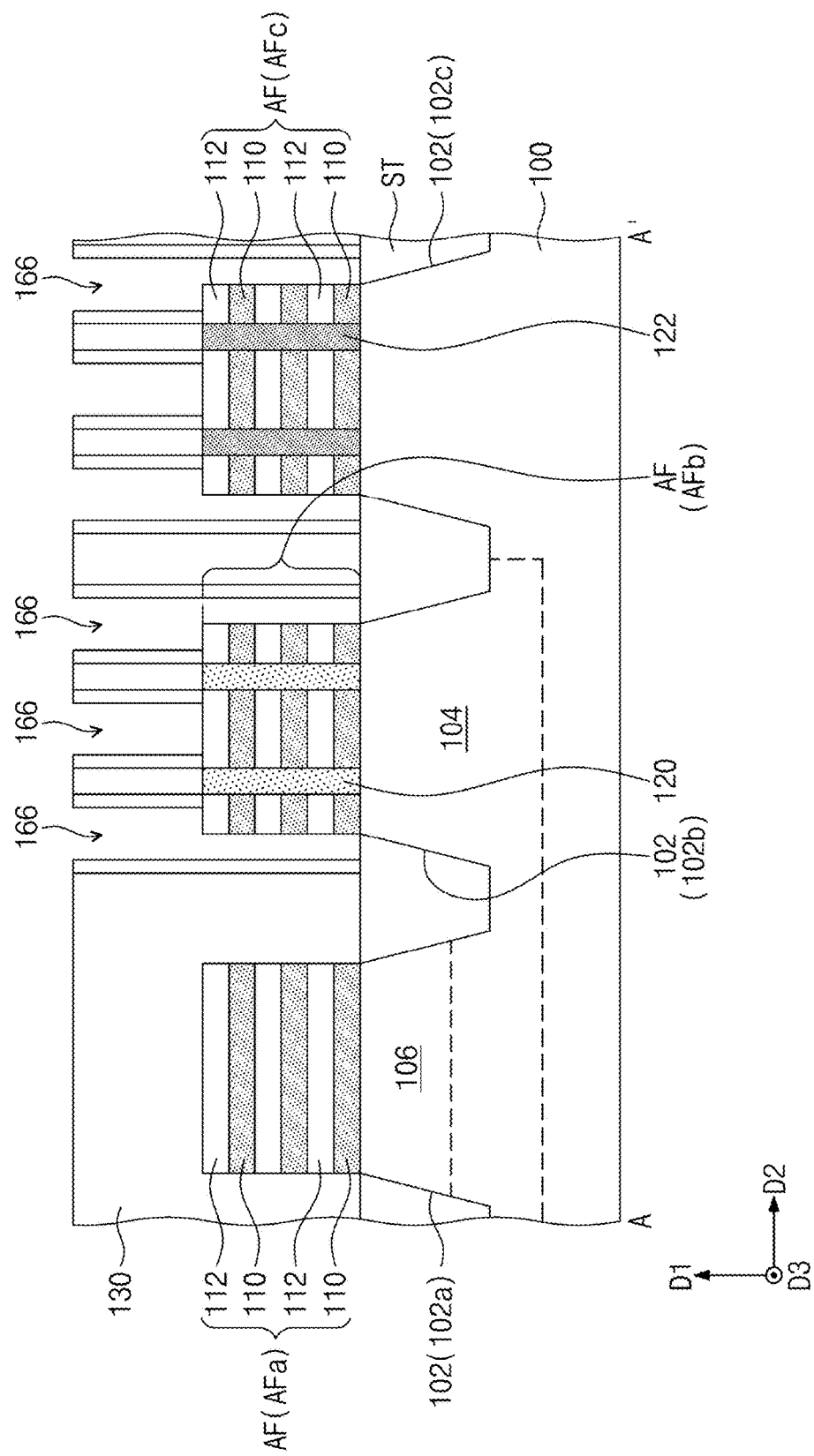
Figure 7B:
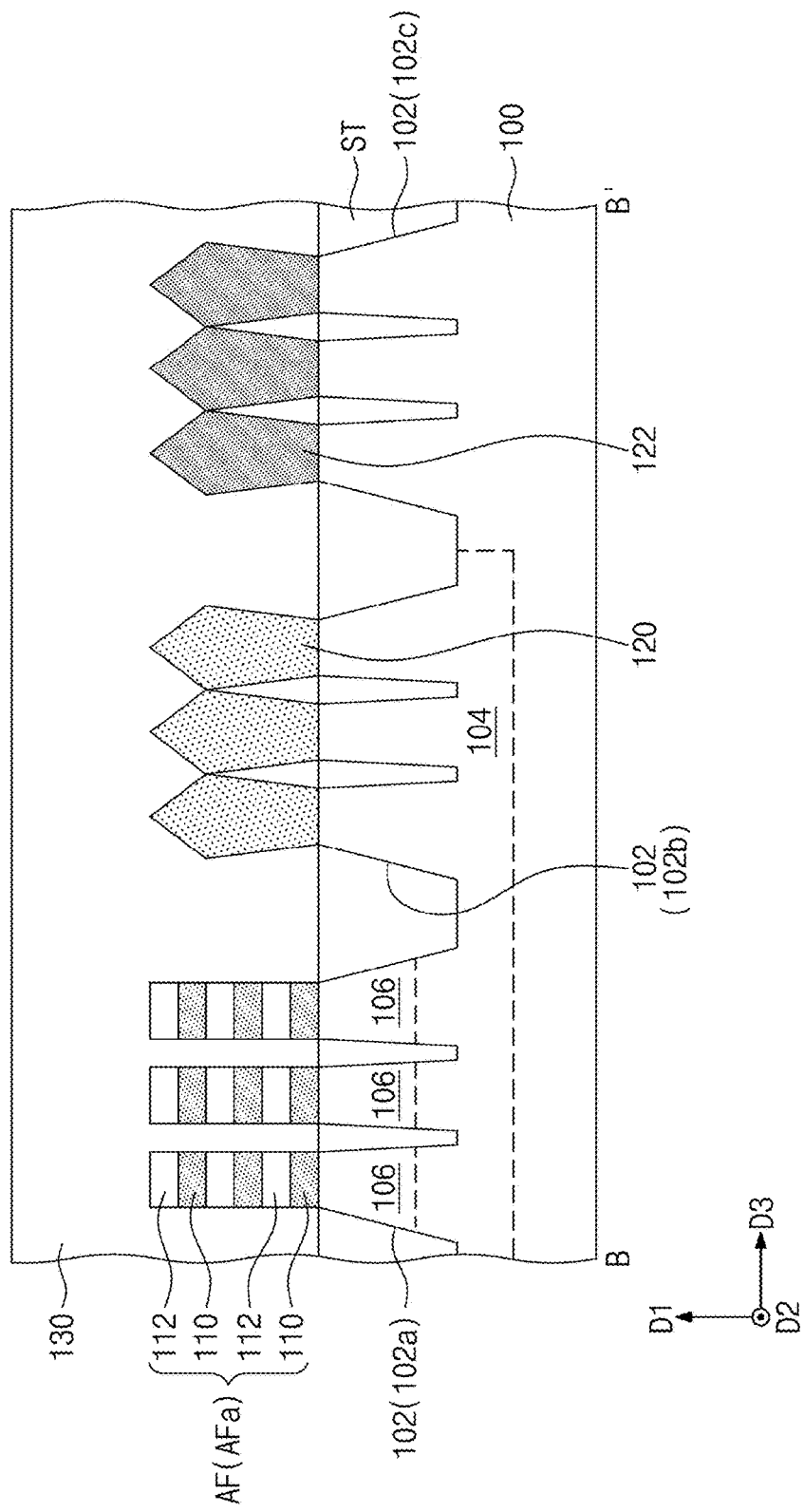

Referring to FIGS. 1, 7A, and 7B, the lower interlayer dielectric layer 130 may be planarized until the sacrificial gate pattern 160 is exposed. The gate mask pattern 164 may be removed when the lower interlayer dielectric layer 130 is planarized. The sacrificial gate pattern 160 and the etch stop pattern 162 may be removed, and thus gap regions 166 may be formed in the lower interlayer dielectric layer 130. Each of the gap regions 166 may be an empty space between the gate spacers GSP. The gap regions 166 may expose corresponding active fins AF. The formation of the gap regions 166 may include selectively etching the sacrificial gate pattern 160 by performing an etching process having an etch selectivity with respect to the gate spacers GSP, the lower interlayer dielectric layer 130, and the etch stop pattern 162, and then removing the etch stop pattern 162 to expose the semiconductor patterns 112 and the sacrificial patterns 110 of the corresponding active fin AF.

Figure 8A:
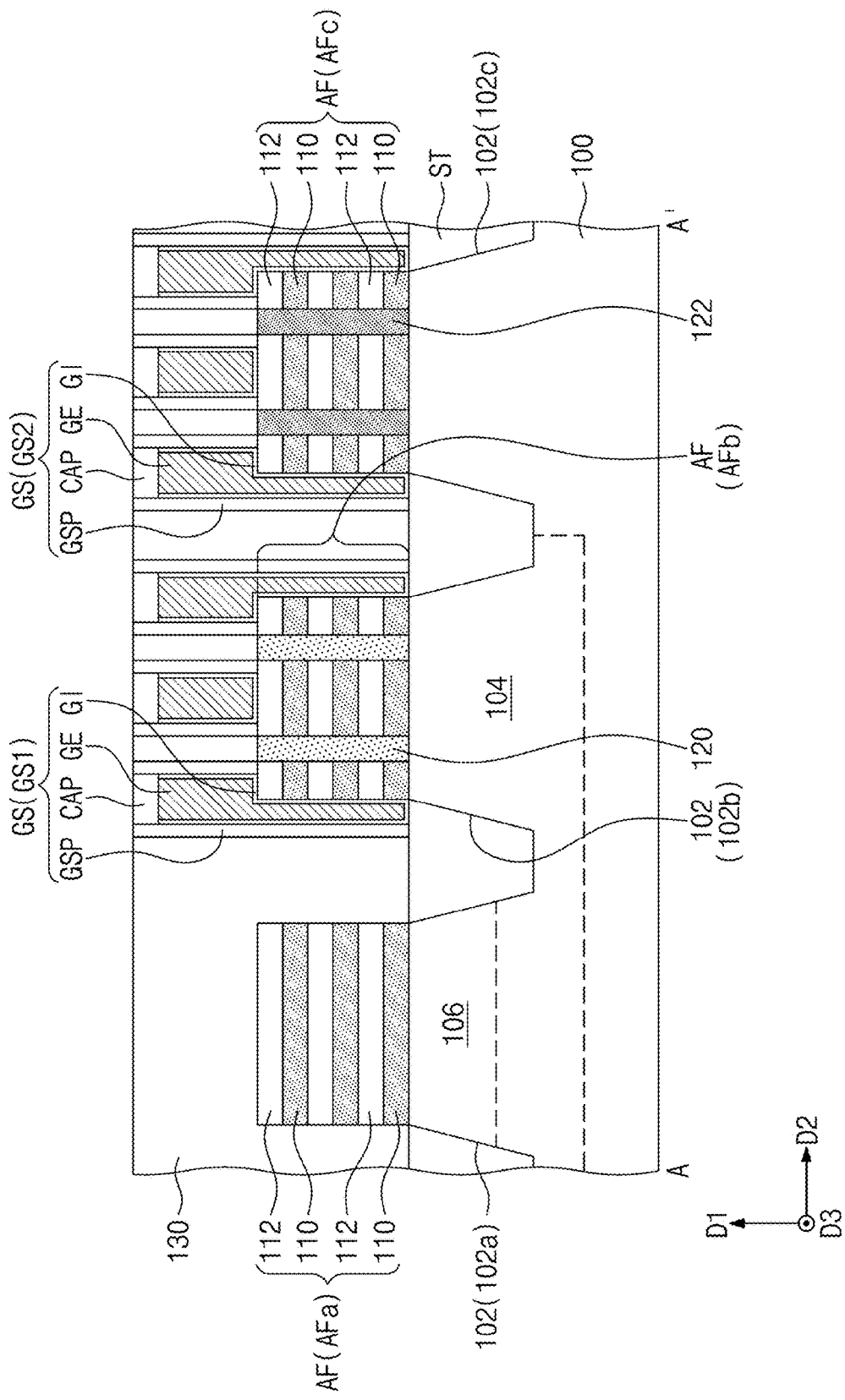
Figure 8B:
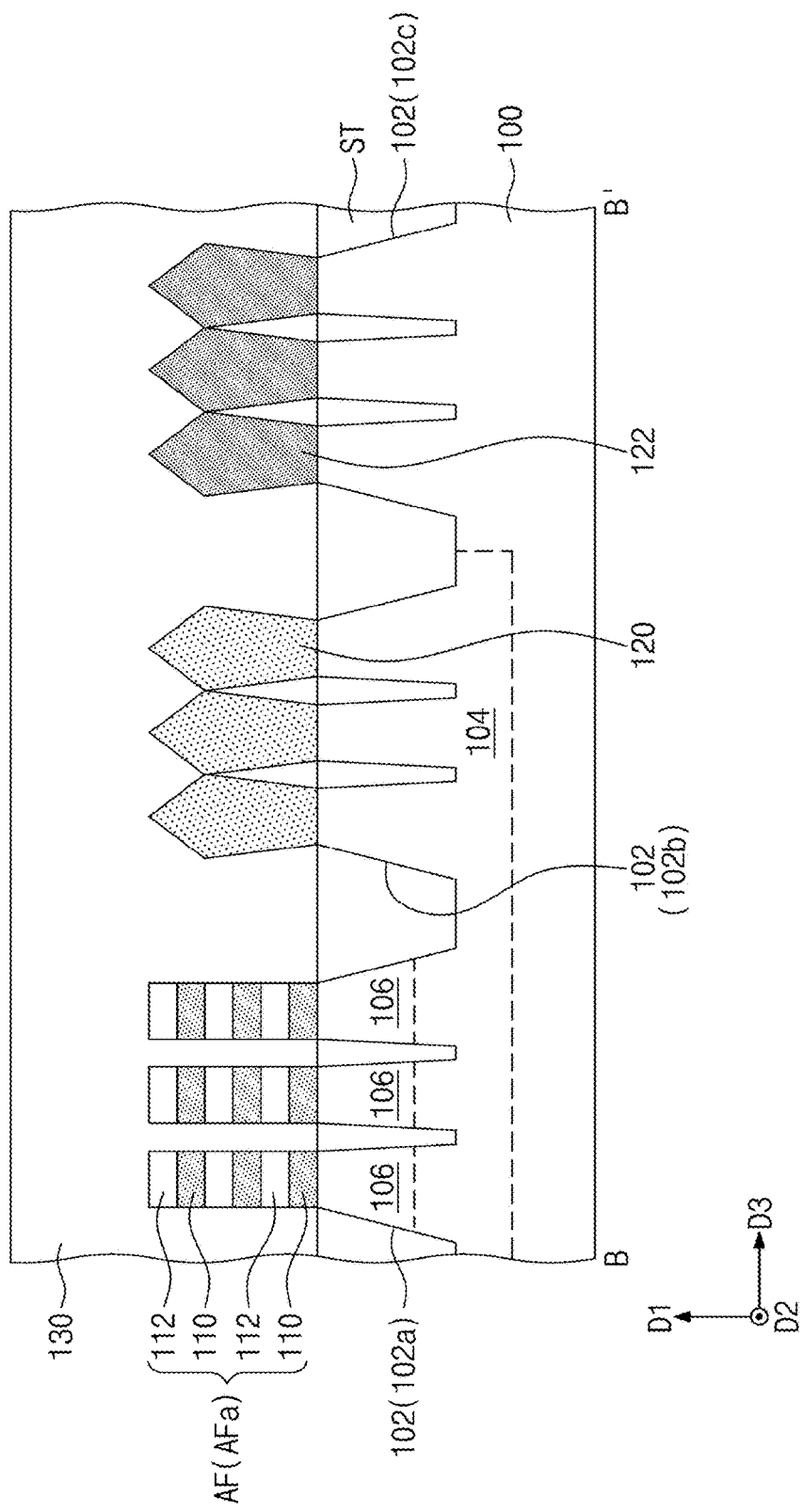

Referring to FIGS. 1, 8A, and 8B, a gate dielectric pattern GI and a gate electrode GE may fill each of the gap regions 166. The formation of the gate dielectric pattern GI and the gate electrode GE may include forming a gate dielectric layer that conformally covers an inner surface of each of the gap regions 166, forming a gate conductive layer that fills a remaining portion of each of the gap regions 166, and then locally forming the gate dielectric pattern GI and the gate electrode GE in each of the gap regions 166 by performing a planarization process until the lower interlayer dielectric layer 130 is exposed. Upper portions of the gate dielectric pattern GI and the gate electrode GE may be recessed to form a groove between the gate spacers GSP. A gate capping pattern CAP may be formed in the groove. The formation of the gate capping pattern CAP may include forming on the lower interlayer dielectric layer 130 a gate capping layer that fills the groove, and planarizing the gate capping layer until the lower interlayer dielectric layer 130 is exposed.

Referring back to FIGS. 1, 2A, and 2B, an upper interlayer dielectric layer 140 may be formed on the lower interlayer dielectric layer 130. Contact plugs CT may be formed in the upper interlayer dielectric layer 140 and the lower interlayer dielectric layer 130. Each of the contact plugs CT may include a conductive pattern 150 that penetrates the upper interlayer dielectric layer 140 and extends into the lower interlayer dielectric layer 130, and also include a barrier pattern 152 that covers lateral and bottom surfaces of the conductive pattern 150. The formation of the contact plugs CT may include forming contact holes in the upper interlayer dielectric layer 140 and the lower interlayer dielectric layer 130, forming a barrier layer that fills a portion of each of the contact holes, forming a conductive layer that fills a remaining portion of each of the contact holes, and performing a planarization process to planarize the conductive layer and the barrier layer until the upper interlayer dielectric layer 140 is exposed. The planarization process may cause that the conductive pattern 150 and the barrier pattern 152 are locally formed in each of the contact holes. A first contact plug CTa of the contact plugs CT may be connected to the first active fin AFa. Among the contact plugs CT, a second contact plug CTb and a third contact plug CTc may have a connection with the first connection pattern 120 and the second connection pattern 122, respectively.

Figure 9:
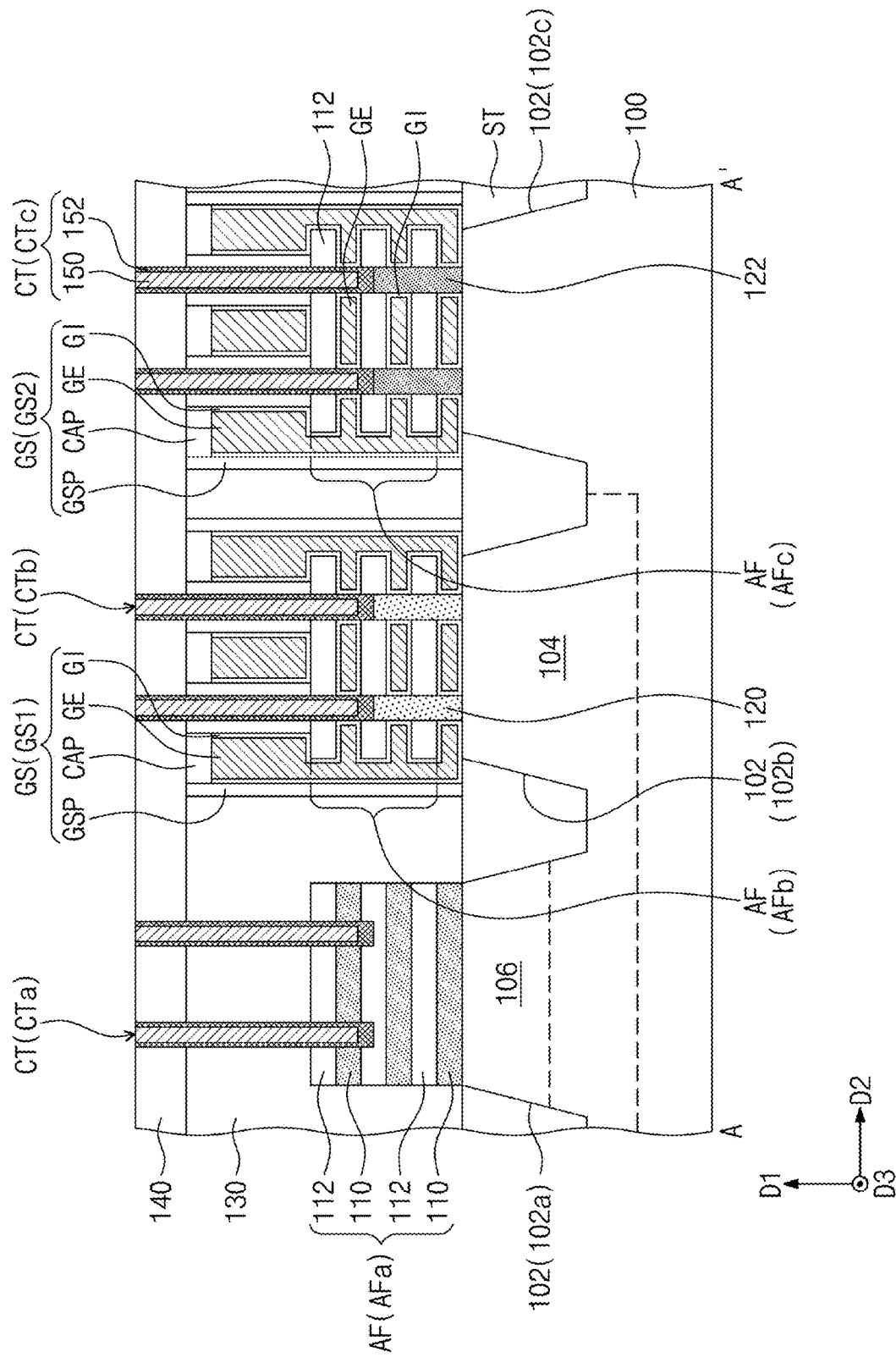
FIGS. 9 to 11, 15, and 16 illustrate cross-sectional views taken along line A-A' of FIG. 1, showing semiconductor devices according to some example embodiments of inventive concepts.

FIG. 9 illustrates a cross-sectional view taken along line A-A' of FIG. 1, showing a semiconductor device according to some example embodiments of inventive concepts. The following semiconductor device is similar to that discussed with reference to FIGS. 1, 2A, and 2B, and thus only differences between the semiconductor devices will be described below in the interest of brevity of description.

Referring to FIGS. 1, 2B, and 9, active fins AF may be disposed on corresponding active patterns 102. The active fins AF may include a first active fin AFa on the first active pattern 102a, a second active fin AFb on the second active pattern 102b, and a third active fin AFc on the third active pattern 102c. The first active fin AFa may include the sacrificial patterns 110 and the semiconductor patterns 112 that are alternately stacked on the first active pattern 102a. Each of the second and third active fins AFb and AFc may include the semiconductor patterns 112 that are spaced apart from each other along the first direction D1.

The first active fin AFa may include impurities having the first conductivity type. In some example embodiments, the sacrificial patterns 110 and the semiconductor patterns 112 of the first active fin AFa may include impurities having the first conductivity type. The first connection pattern 120 may penetrate the semiconductor patterns 112 of the second active fin AFb and be connected to the well region 104. The first connection pattern 120 may include impurities having the second conductivity type. The second connection pattern 122 may penetrate the semiconductor patterns 112 of the third active fin AFc and be connected to the substrate 100. The second connection pattern 122 may include impurities having the first conductivity type.

The substrate 100 may be provided thereon with the gate structures GS that run across the active fins AF. The gate structures GS may include the first gate structures GS1 that run across the second active fin AFb and the second gate structures GS2 that run across the third active fin AFc.

In some example embodiments, the gate electrode GE and the gate dielectric pattern GI of each of the first gate structures GS1 may extend between the semiconductor patterns 112 of the second active fin AFb and between the second active fin AFb and the second active pattern 102b. The semiconductor patterns 112 of the second active fin AFb may be spaced apart from the gate electrode GE by the gate dielectric pattern GI. In some example embodiments, the gate dielectric pattern GI of each of the first gate structures GS1 may extend between the first connection pattern 120 and the gate electrode GE, and may contact the first connection pattern 120. The gate electrode GE and the gate dielectric pattern GI of each of the second gate structures GS2 may extend between the semiconductor patterns 112 of the third active fin AFc and between the third active fin AFc and the third active pattern 102c. The semiconductor patterns 112 of the third active fin AFc may be spaced apart from the gate electrode GE by the gate dielectric pattern GI. In some example embodiments, the gate dielectric pattern GI of each of the second gate structures GS2 may extend between the second connection pattern 122 and the gate electrode GE, and may contact the second connection pattern 122.

According to some example embodiments of inventive concepts, the first gate structures GS1 and the second active fin AFb may implement a structure similar to that of a multi-bridge channel field effect transistor, and the second gate structures GS2 and the third active fin AFc may implement a structure similar to that of a multi-bridge channel field effect transistor. Therefore, it may be possible to provide a vertical bipolar junction transistor that is compatible with those of the multi-bridge channel field effect transistors.

Figure 10:
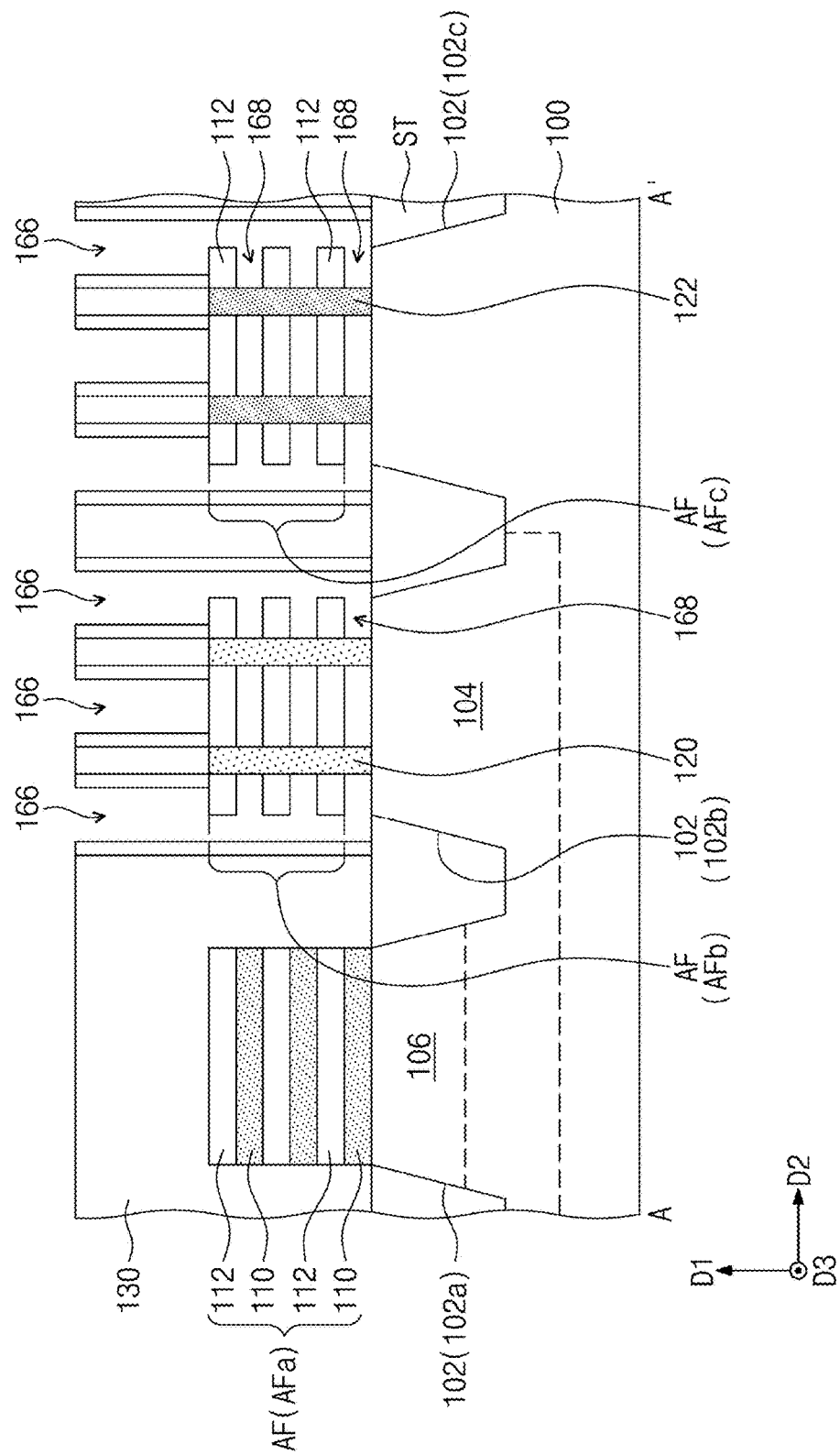

FIG. 10 illustrates a cross-sectional view taken along line A-A' of FIG. 1, showing an intermediate structure of a semiconductor device according to some example embodiments of inventive concepts. The following method of fabricating such semiconductor device is similar to the method discussed with reference to FIGS. 3A to 8A and 3B to 8B, and thus only differences between the methods will be described below in the interest of brevity of description.

Referring to FIGS. 1, 7B, and 10, after the formation of the gap regions 166, the sacrificial patterns 110 which are exposed to the gap regions 166 may be selectively removed. The selective removal of the sacrificial patterns 110 may form empty regions 168 between the semiconductor patterns 112 and between a lowermost one of the semiconductor patterns 112 and a corresponding one of the active patterns 102. The empty regions 168 may be spatially connected to the gap regions 166. Afterwards, as discussed with reference to FIGS. 1, 8A, and 8B, a gate dielectric pattern GI and a gate electrode GE may fill the gap regions 166 and the empty regions 168.

Figure 11:
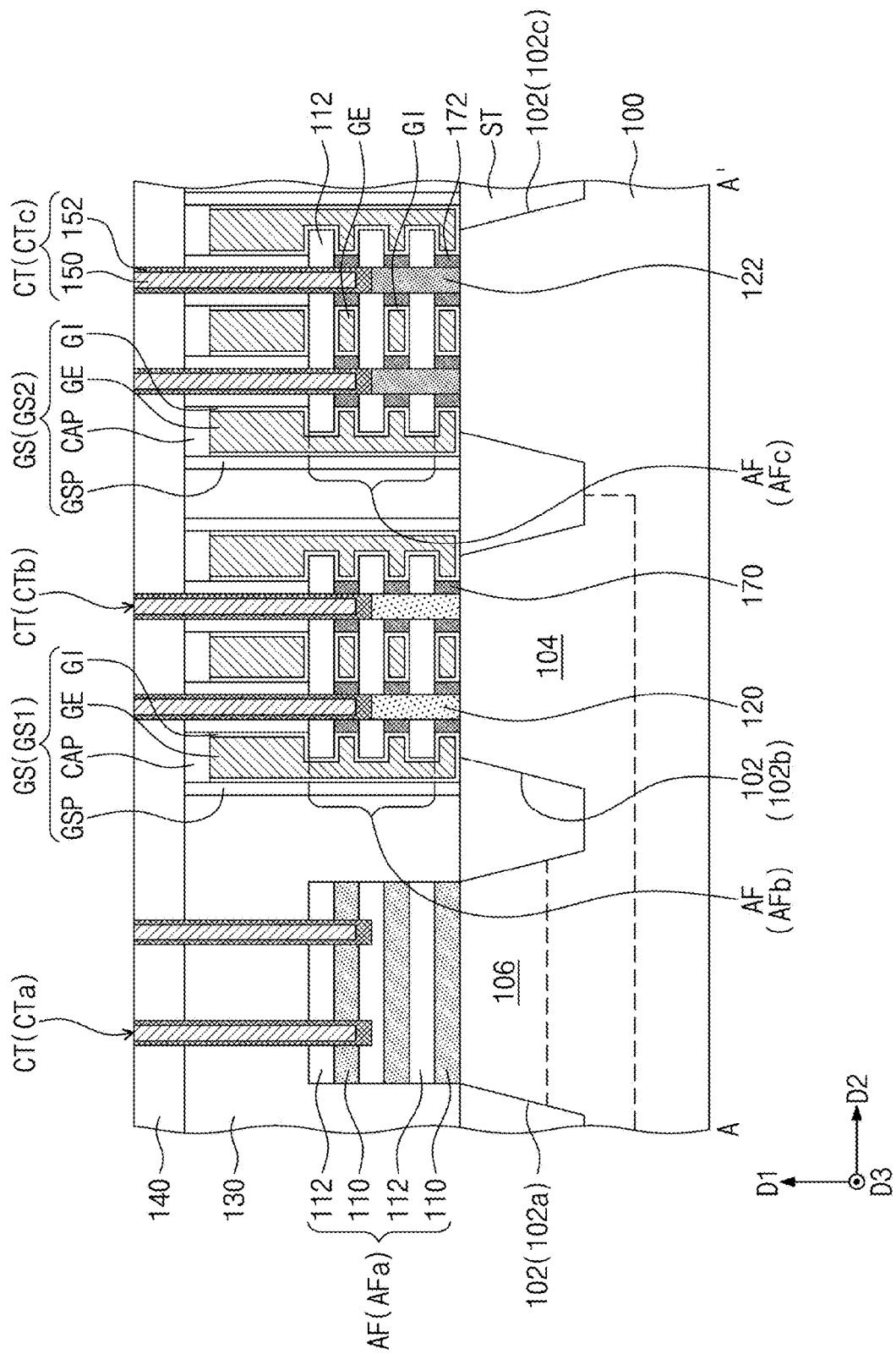

FIG. 11 illustrates a cross-sectional view taken along line A-A' of FIG. 1, showing a semiconductor device according to some example embodiments of inventive concepts.

Referring to FIGS. 1, 2B, and 11, first spacer patterns 170 may be disposed between the semiconductor patterns 112 of the second active fin AFb. The first spacer patterns 170 and the semiconductor patterns 112 may be alternately stacked along the first direction D1. Each of the first spacer patterns 170 may be disposed between the semiconductor patterns 112 that neighbor each other in the first direction D1 and/or between a lowermost semiconductor pattern 112 and the second active pattern 102b. The gate electrode GE of each of the first gate structures GS1 may be spaced apart from the first connection pattern 120 by the first spacer patterns 170. The gate dielectric pattern GI of each of the first gate structures GS1 may extend between the gate electrode GE and a corresponding one of the first spacer patterns 170.

Second spacer patterns 172 may be disposed between the semiconductor patterns 112 of the third active fin AFc. The second spacer patterns 172 and the semiconductor patterns 112 may be alternately stacked along the first direction D1. Each of the second spacer patterns 172 may be disposed between the semiconductor patterns 112 that neighbor each other in the first direction D1 and/or between a lowermost semiconductor pattern 112 and the third active pattern 102c. The gate electrode GE of each of the second gate structures GS2 may be spaced apart from the second connection pattern 122 by the second spacer patterns 172. The gate dielectric pattern GI of each of the second gate structures GS2 may extend between the gate electrode GE and a corresponding one of the second spacer patterns 172. Except for the difference mentioned above, the semiconductor device according the present embodiment may be the same as or substantially similar to that discussed with reference to FIGS. 1, 2B, and 9.

Figure 12:
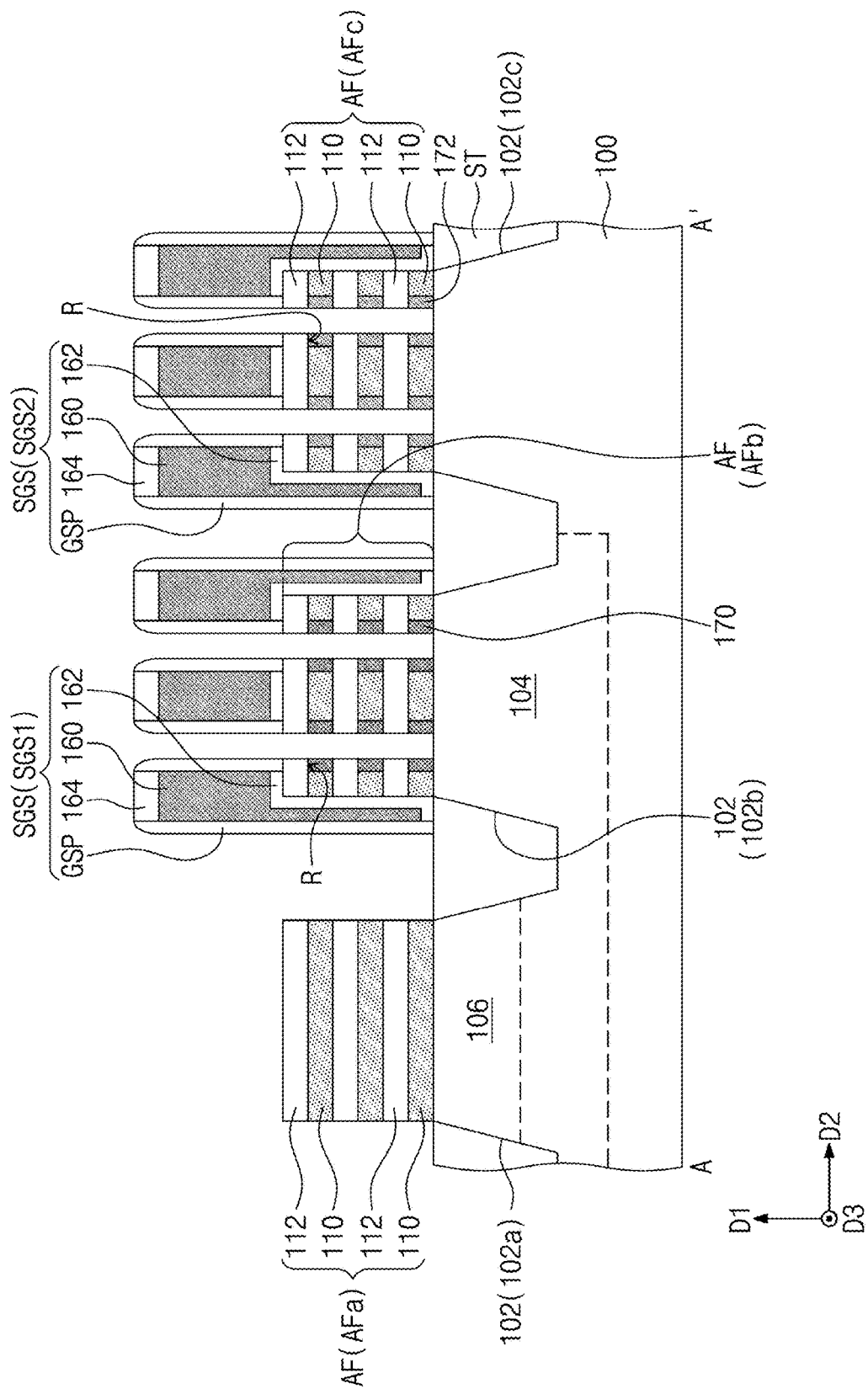
FIGS. 12 to 14 illustrate cross-sectional views taken along line A-A' of FIG. 1, showing a method of fabricating a semiconductor device according to some example embodiments of inventive concepts.
Figure 13:
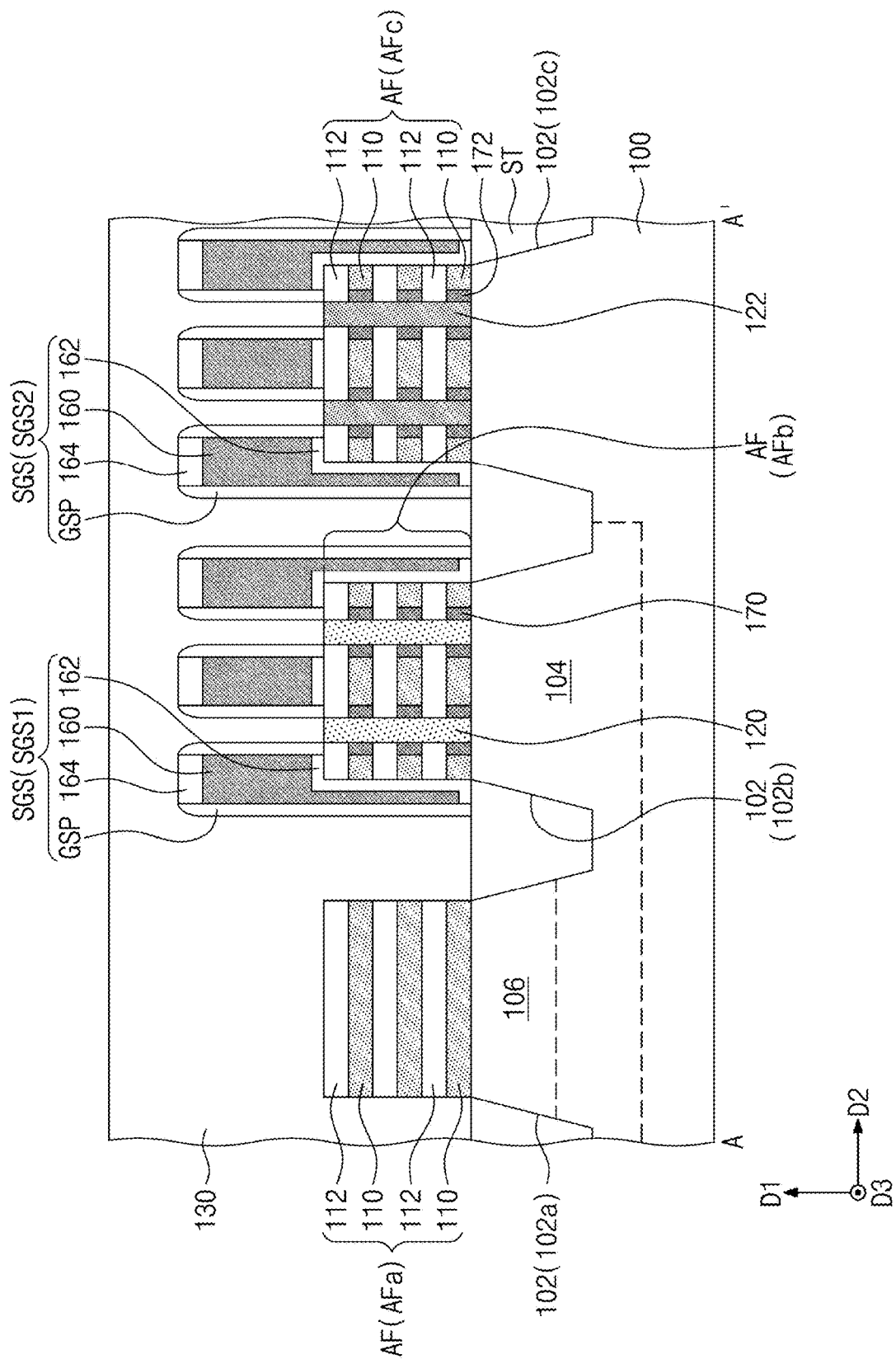
Figure 14:
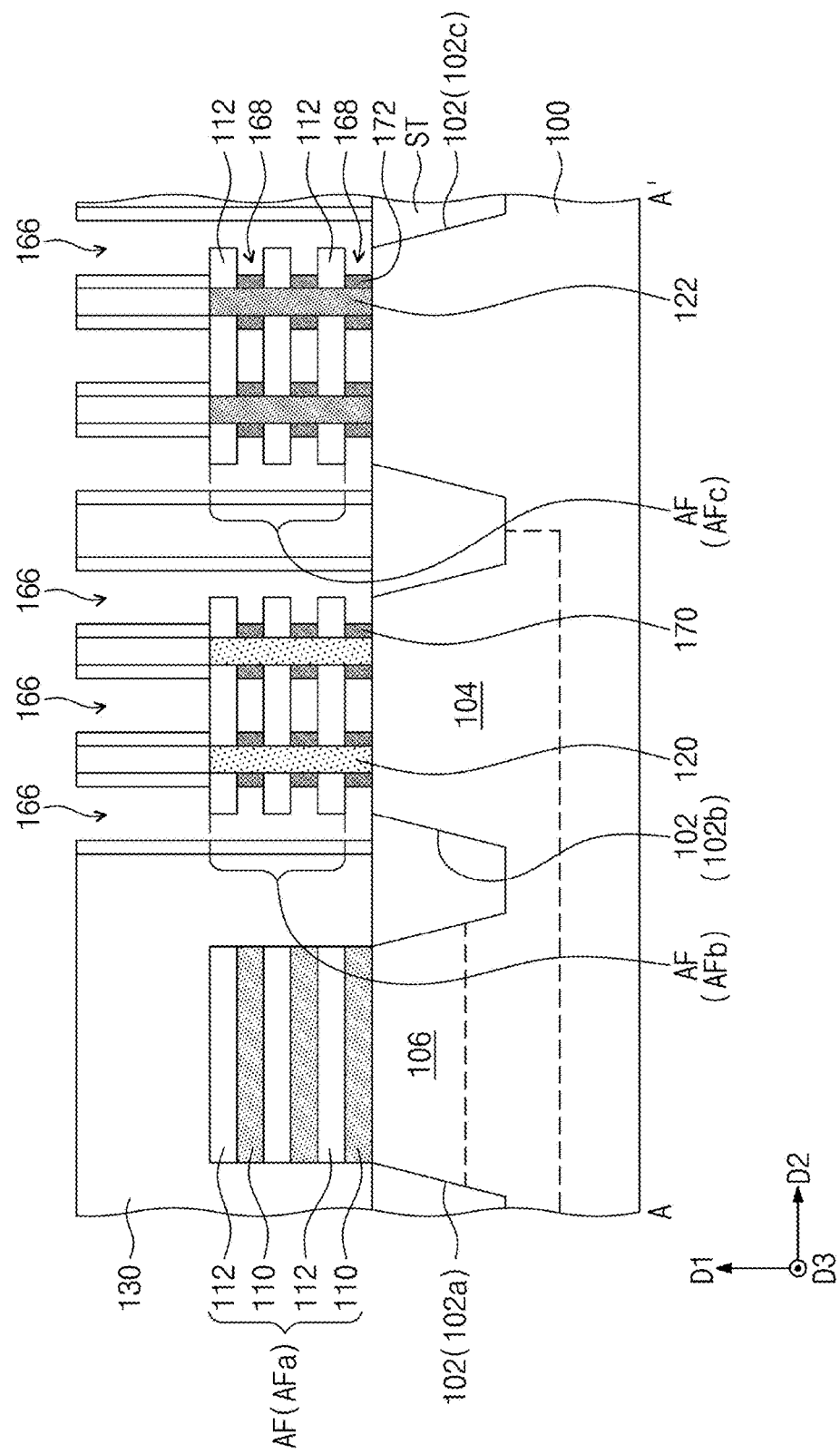

FIGS. 12 to 14 illustrate cross-sectional views taken along line A-A' of FIG. 1, showing a method of fabricating a semiconductor device according to some example embodiments of inventive concepts. The following method of fabricating a semiconductor device is similar to that discussed with reference to FIGS. 3A to 8A and 3B to 8B, and thus only differences between the methods will be described below in the interest of brevity of description.

Referring to FIGS. 1, 5B, and 12, the second active fin AFb may be partially removed between the first sacrificial gate structures SGS1. Therefore, lateral surfaces of the sacrificial patterns 110 and the semiconductor patterns 112 of the second active fin AFb and a top surface of the second active pattern 102b may be exposed between the first sacrificial gate structures SGS1. Further, the third active fin AFc may be partially removed between the second sacrificial gate structures SGS2. Thus, lateral surfaces of the sacrificial patterns 110 and the semiconductor patterns 112 of the third active fin AFc and a top surface of the third active pattern 102c may be exposed between the second sacrificial gate structures SGS2.

The exposed lateral surfaces of the sacrificial patterns 110 may be horizontally recessed to form recesses R. The recesses R may be formed by performing a wet etching process that selectively etches the sacrificial patterns 110. Afterwards, first and second spacer patterns 170 and 172 may be formed respectively in the recesses R. The formation of the first and second spacer patterns 170 and 172 may include conformally forming on the substrate 100 a spacer layer that fills the recesses R, and anisotropically etching the spacer layer to locally form the first and second spacer patterns 170 and 172 in respective recesses R. The first and second spacer patterns 170 and 172 may include a low-k dielectric layer (e.g., silicon nitride).

Referring to FIGS. 1, 6B, and 13, the first connection pattern 120 may be formed on the second active pattern 102b between the first sacrificial gate structures SGS1. The first connection pattern 120 may be in contact with the lateral surfaces of the semiconductor patterns 112 of the second active fin AFb and spaced apart from the sacrificial patterns 110 of the second active fin AFb. Each of the first spacer patterns 170 may be interposed between the first connection pattern 120 and one of the sacrificial patterns 110 of the second active fin AFb. The second connection pattern 122 may be formed on the third active pattern 102c between the second sacrificial gate structures SGS2. The second connection pattern 122 may be in contact with the lateral surfaces of the semiconductor patterns 112 of the third active fin AFc and spaced apart from the sacrificial patterns 110 of the third active fin AFc. Each of the second spacer patterns 172 may be interposed between the second connection pattern 122 and one of the sacrificial patterns 110 of the third active fin AFc. On the substrate 100, the lower interlayer dielectric layer 130 may cover the active fins AF, the first and second connection patterns 120 and 122, and the sacrificial gate structures SGS.

Referring to FIGS. 1, 7B, and 14, the gap regions 166 may be formed in the lower interlayer dielectric layer 130. After the formation of the gap regions 166, the sacrificial patterns 110 which are exposed to the gap regions 166 may be selectively removed. The selective removal of the sacrificial patterns 110 may form empty regions 168 between the semiconductor patterns 112 and between a lowermost one of the semiconductor patterns 112 and a corresponding one of the active patterns 102. The empty regions 168 may be spatially connected to the gap regions 166. Each of the empty regions 168 may expose a corresponding one of the first and second spacer patterns 170 and 172. Afterwards, as discussed with reference to FIGS. 1, 8A, and 8B, a gate dielectric pattern GI and a gate electrode GE may fill the gap regions 166 and the empty regions 168.

Figure 15:
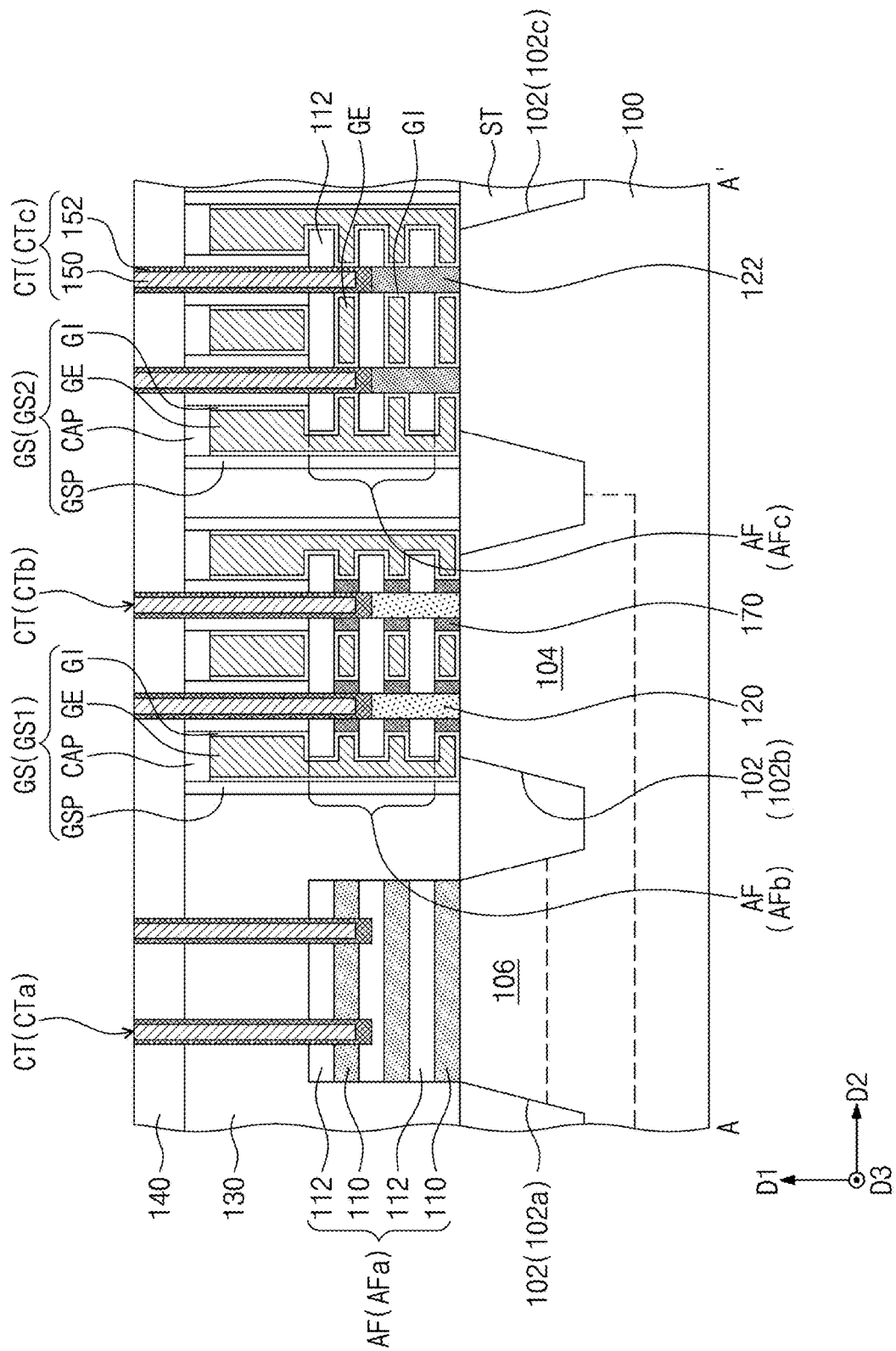

FIG. 15 illustrates a cross-sectional view taken along line A-A' of FIG. 1, showing a semiconductor device according to some example embodiments of inventive concepts. Referring to FIGS. 1, 2B, and 15, a semiconductor device according to the present embodiment may be the same as or substantially similar to that discussed with reference to FIGS. 1, 2B, and 11, except for that the second spacer patterns 172 are omitted.

Figure 16:
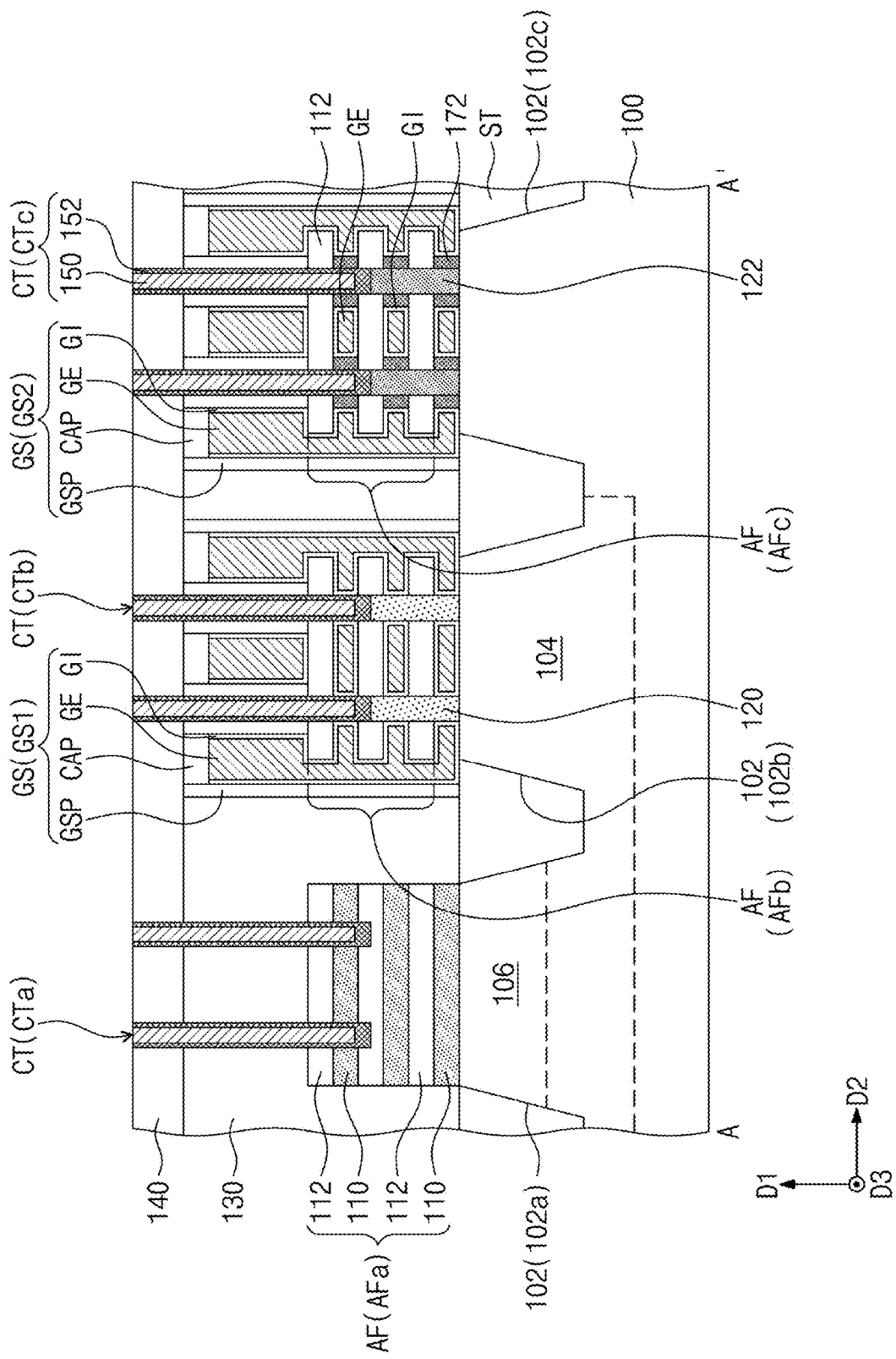

FIG. 16 illustrates a cross-sectional view taken along line A-A' of FIG. 1, showing a semiconductor device according to some example embodiments of inventive concepts. Referring to FIGS. 1, 2B, and 16, a semiconductor device according to the present embodiment may be the same as or substantially similar to that discussed with reference to FIGS. 1, 2B, and 11, except for that the first spacer patterns 170 are omitted.

Figure 17:
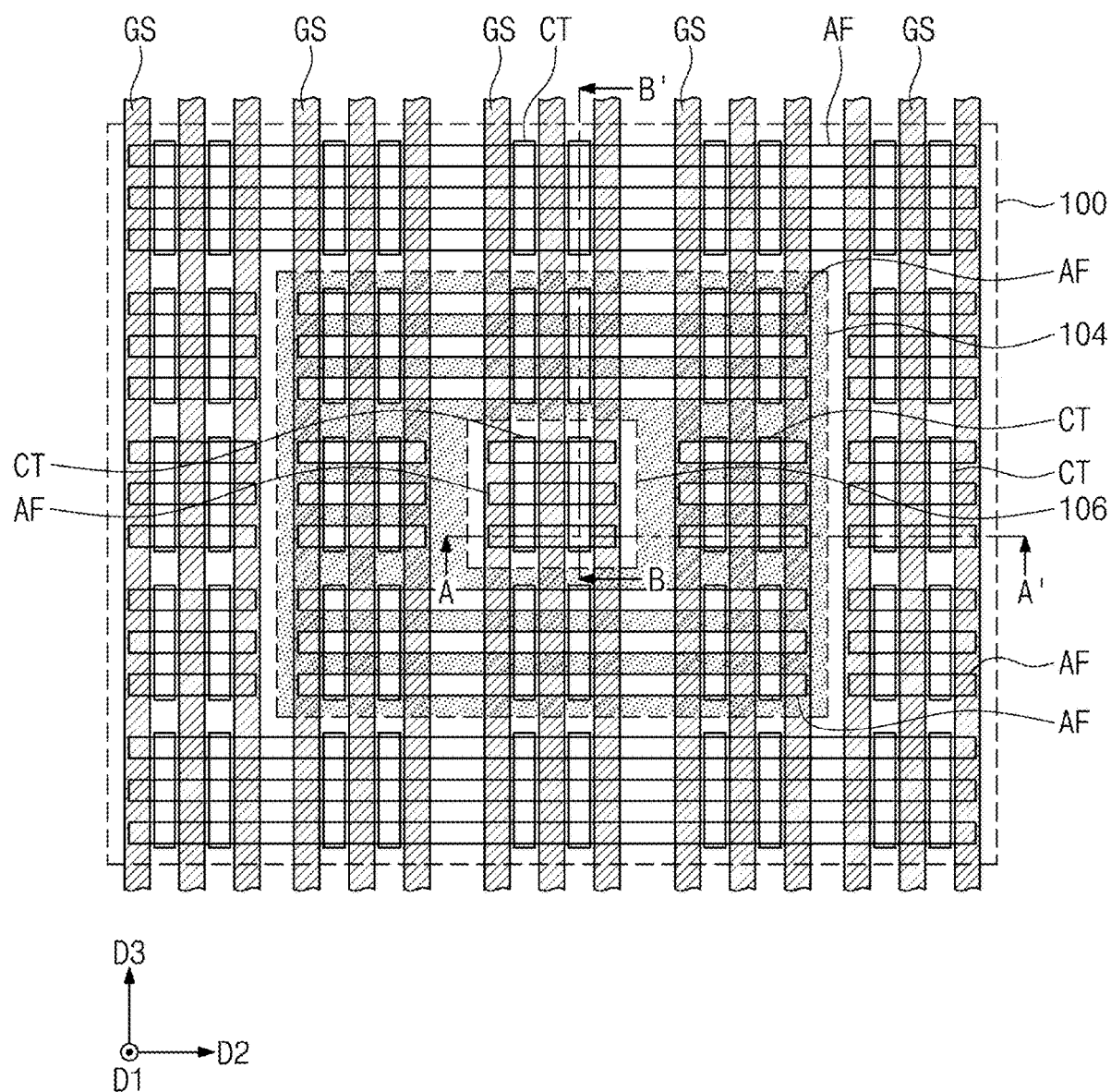
FIG. 17 illustrates a plan view showing a semiconductor device according to some example embodiments of inventive concepts.
Figure 18:
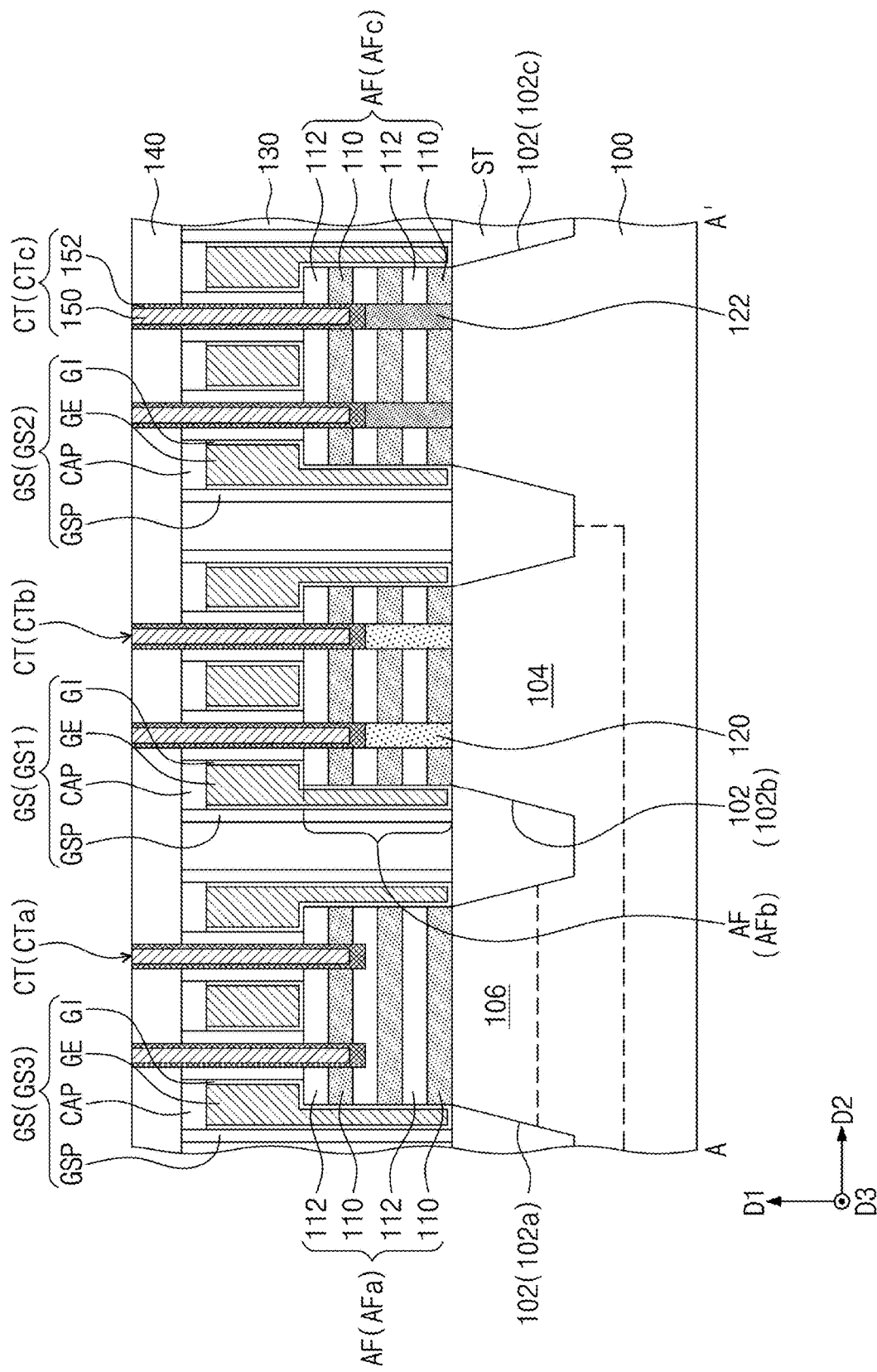
FIG. 18 illustrates a cross-sectional view taken along line A-A' of FIG. 17.

FIG. 17 illustrates a plan view showing a semiconductor device according to some example embodiments of inventive concepts. FIG. 18 illustrates a cross-sectional view taken along line A-A' of FIG. 17. The cross-section along line B-B' of FIG. 17 may be the same as or substantially similar to that of FIG. 2B. The following semiconductor device is similar to that discussed with reference to FIGS. 1, 2A, and 2B, and thus only differences between the semiconductor devices will be described below in the interest of brevity of description.

Referring to FIGS. 17, 18, and 2B, the substrate 100 may be provided thereon with gate structures GS that run across the active fins AF. The gate structures GS may include first gate structures GS1 that run across the second active fin AFb and second gate structures GS2 that run across the third active fin AFc. In some example embodiments, the gate structures GS may further include third gate structures GS3 that run across the first active fin AFa. The third gate structures GS3 may be spaced apart from each other in the second direction D2 on the first active fin AFa. The gate electrode GE of each of the third gate structures GS3 may run across the first active fin AFa and cover lateral surfaces of the first active fin AFa. The gate dielectric pattern GI of each of the third gate structures GS3 may be interposed between the gate electrode GE and the first active fin AFa.

The first contact plug CTa may be interposed between the third gate structures GS3 and connected to the first active fin AFa. The first contact plug CTa may have lateral surfaces in contact with the gate spacers GSP of the third gate structures GS3. In some example embodiments, a plurality of first active patterns 102a may be arranged spaced apart from each other in the third direction D3, and a plurality of first active fins AFa may be correspondingly disposed on the plurality of first active patterns 102a. In this case, the first contact plug CTa may extend in the third direction D3 between the third gate structures GS3 and be connected to the plurality of first active fins AFa.

The impurity region 106, the first active pattern 102a, the first active fin AFa, the third gate structures GS3, and the first contact plug CTa may constitute an emitter of a vertical bipolar junction transistor. The well region 104, the second active pattern 102b, the second active fin AFb, the first connection pattern 120, the first gate structures GS1, and the second contact plug CTb may constitute a base of the vertical bipolar junction transistor. The substrate 100, the third active pattern 102c, the third active fin AFc, the second connection pattern 122, the second gate structures GS2, and the third contact plug CTc may constitute a collector of the vertical bipolar junction transistor. The first, second, and third gate structures GS1, GS2, and GS3 may be dummy gate structures that are electrically floated.

Figure 19:
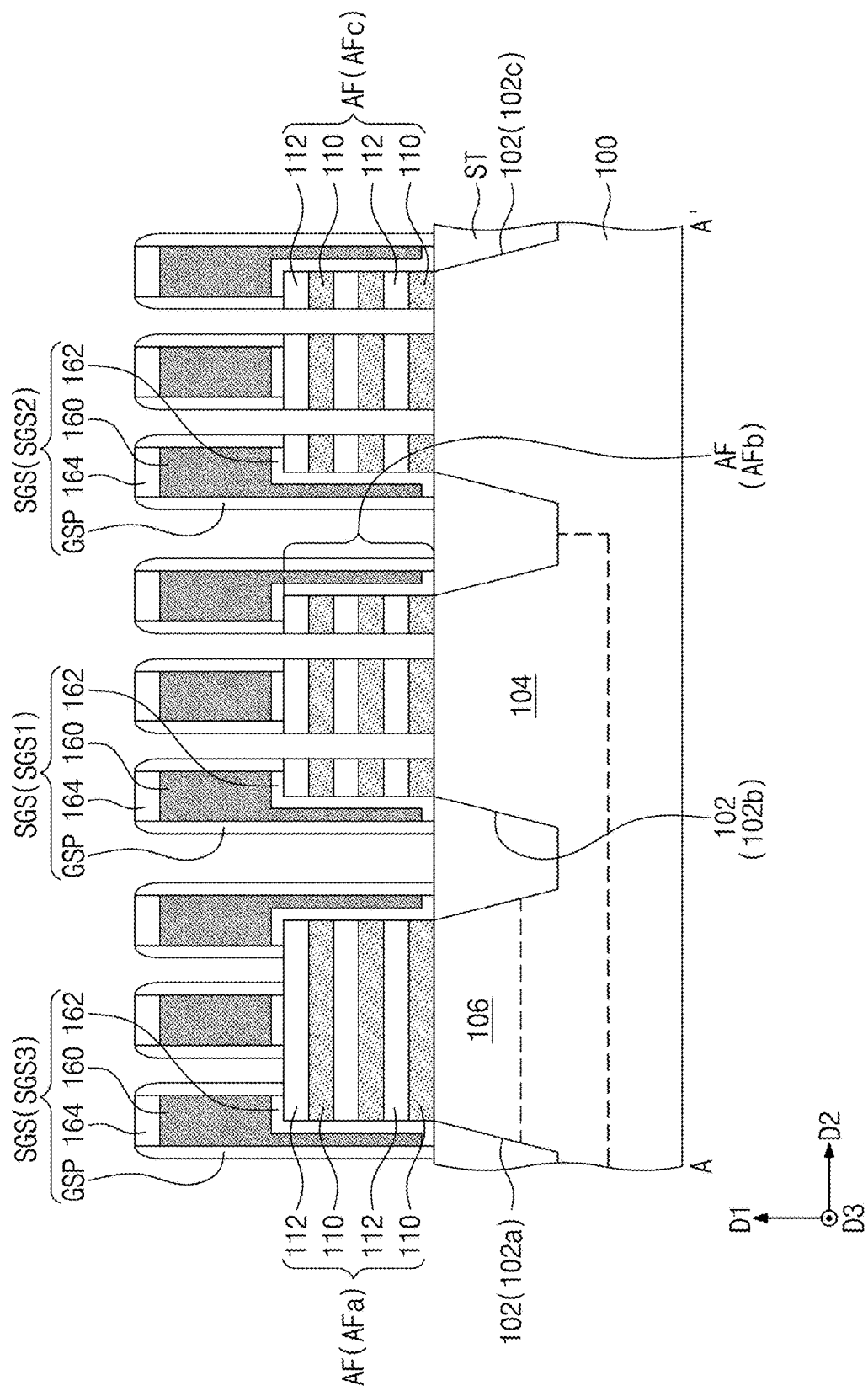
FIGS. 19 to 21 illustrate cross-sectional views taken along line A-A' of FIG. 17, showing a method of fabricating a semiconductor device according to some example embodiments of inventive concepts.
Figure 20:
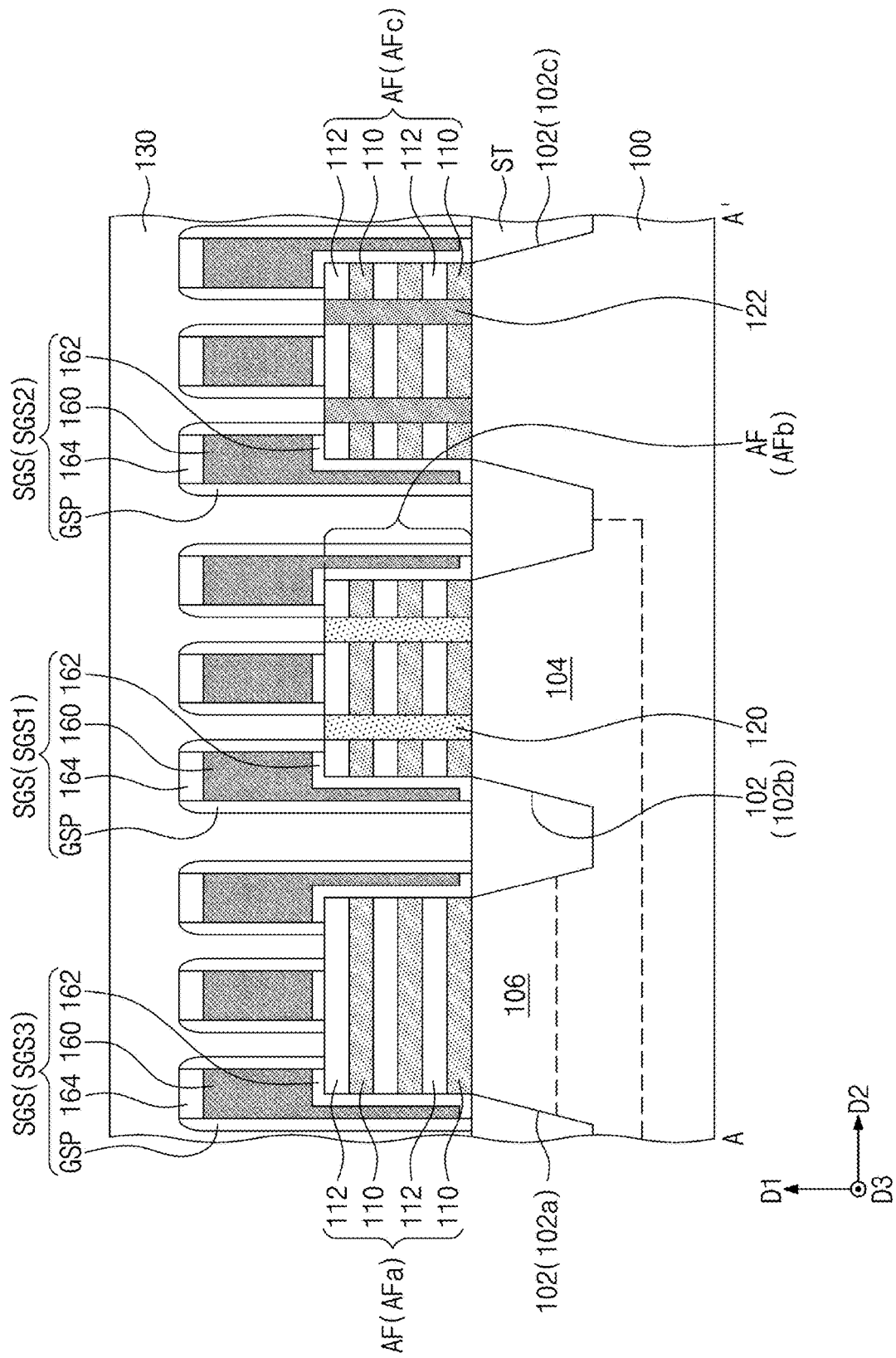
Figure 21:
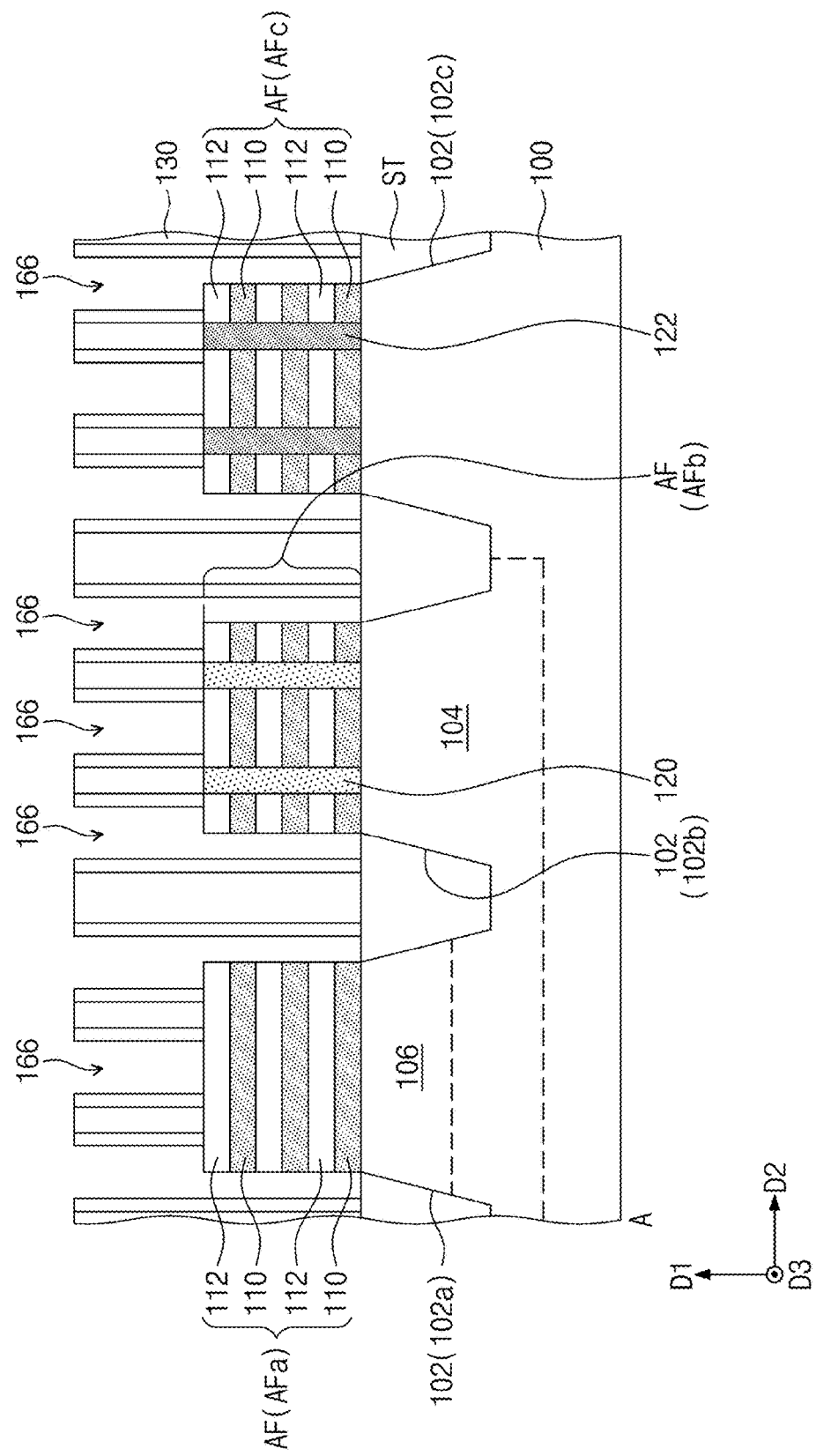

FIGS. 19 to 21 illustrate cross-sectional views taken along line A-A' of FIG. 17, showing a method of fabricating a semiconductor device according to some example embodiments of inventive concepts. The following method of fabricating a semiconductor device is similar to that discussed with reference to FIGS. 3A to 8A and 3B to 8B, and thus only differences between the methods will be described below in the interest of brevity of description.

Referring to FIGS. 17, 19, and 5B, on the substrate 100, sacrificial gate structures SGS may run across the active fins AF. The sacrificial gate structures SGS may include first sacrificial gate structures SGS1 that run across the second active fin AFb and second sacrificial gate structures SGS2 that run across the third active fin AFc. In some example embodiments, the sacrificial gate structures SGS may include third sacrificial gate structures SGS3 that run across the first active fin AFa. The third sacrificial gate structures SGS3 may be spaced apart from each other in the second direction D2 on the first active fin AFa.

The second active fin AFb may be partially removed between the first sacrificial gate structures SGS1, and thus lateral surfaces of the second active fin AFb and a top surface of the second active pattern 102b may be exposed between the first sacrificial gate structures SGS1. The third active fin AFc may be partially removed between the second sacrificial gate structures SGS2, and thus lateral surfaces of the third active fin AFc and a top surface of the third active pattern 102c may be exposed between the second sacrificial gate structures SGS2. During the removal of the portions of the second and third active fins AFb and AFc, a mask layer (not shown) may cover and protect the first active fin AFa and the third sacrificial gate structures SGS3.

Referring to FIGS. 17, 20, and 6B, the first connection pattern 120 may be formed on the second active pattern 102b between the first sacrificial gate structures SGS1. The second connection pattern 122 may be formed on the third active pattern 102c between the second sacrificial gate structures SGS2. During the formation of the first and second connection patterns 120 and 122, the mask layer (not shown) may cover and protect the first active fin AFa and the third sacrificial gate structures SGS3. After the formation of the first and second connection patterns 120 and 122, the mask layer may be removed. Thereafter, on the substrate 100, the lower interlayer dielectric layer 130 may cover the active fins AF, the first and second connection patterns 120 and 122, and the sacrificial gate structures SGS.

Referring to FIGS. 17, 21, and 7B, the gap regions 166 may be formed in the lower interlayer dielectric layer 130. The gap regions 166 may expose corresponding active fins AF. Afterwards, as discussed with reference to FIGS. 1, 8A, and 8B, a gate dielectric pattern GI and a gate electrode GE may fill the gap regions 166.

Figure 22:
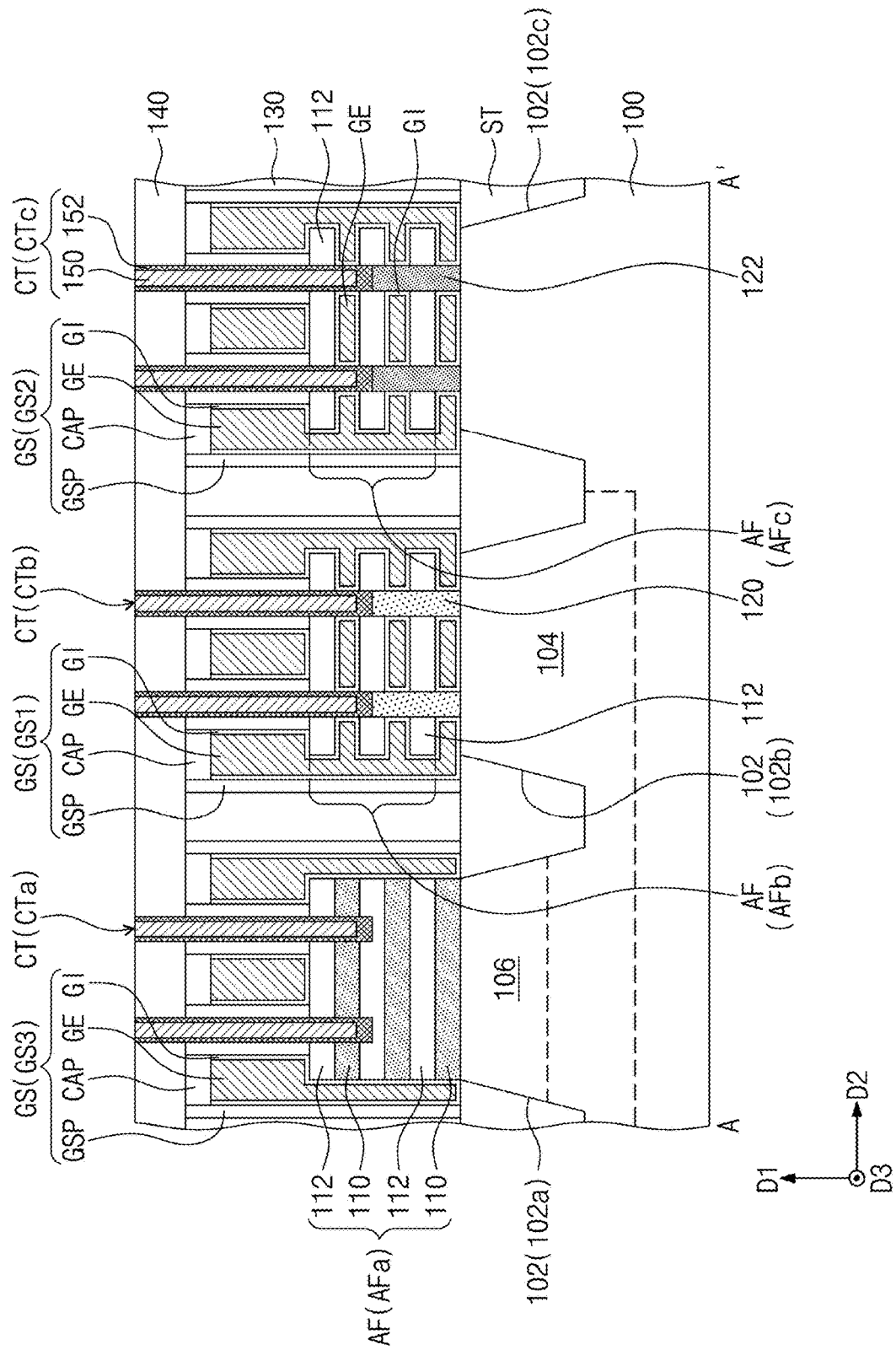
FIG. 22 illustrates a cross-sectional view taken along line A-A' of FIG. 17, showing a semiconductor device according to some example embodiments of inventive concepts.

FIG. 22 illustrates a cross-sectional view taken along line A-A' of FIG. 17, showing a semiconductor device according to some example embodiments of inventive concepts. The following semiconductor device is similar to that discussed with reference to FIGS. 1, 2A, and 2B, and thus only differences between the semiconductor devices will be described below in the interest of brevity of description.

Referring to FIGS. 17, 22, and 2B, in some example embodiments, the gate structures GS may further include third gate structures GS3 that run across the first active fin AFa. The first contact plug CTa may be interposed between the third gate structures GS3 and connected to the first active fin AFa. The first contact plug CTa may have lateral surfaces in contact with the gate spacers GSP of the third gate structures GS3. Except for the difference mentioned above, the semiconductor device according the present embodiment may be the same as or substantially similar to that discussed with reference to FIGS. 1, 2B, and 9.

Figure 23A:
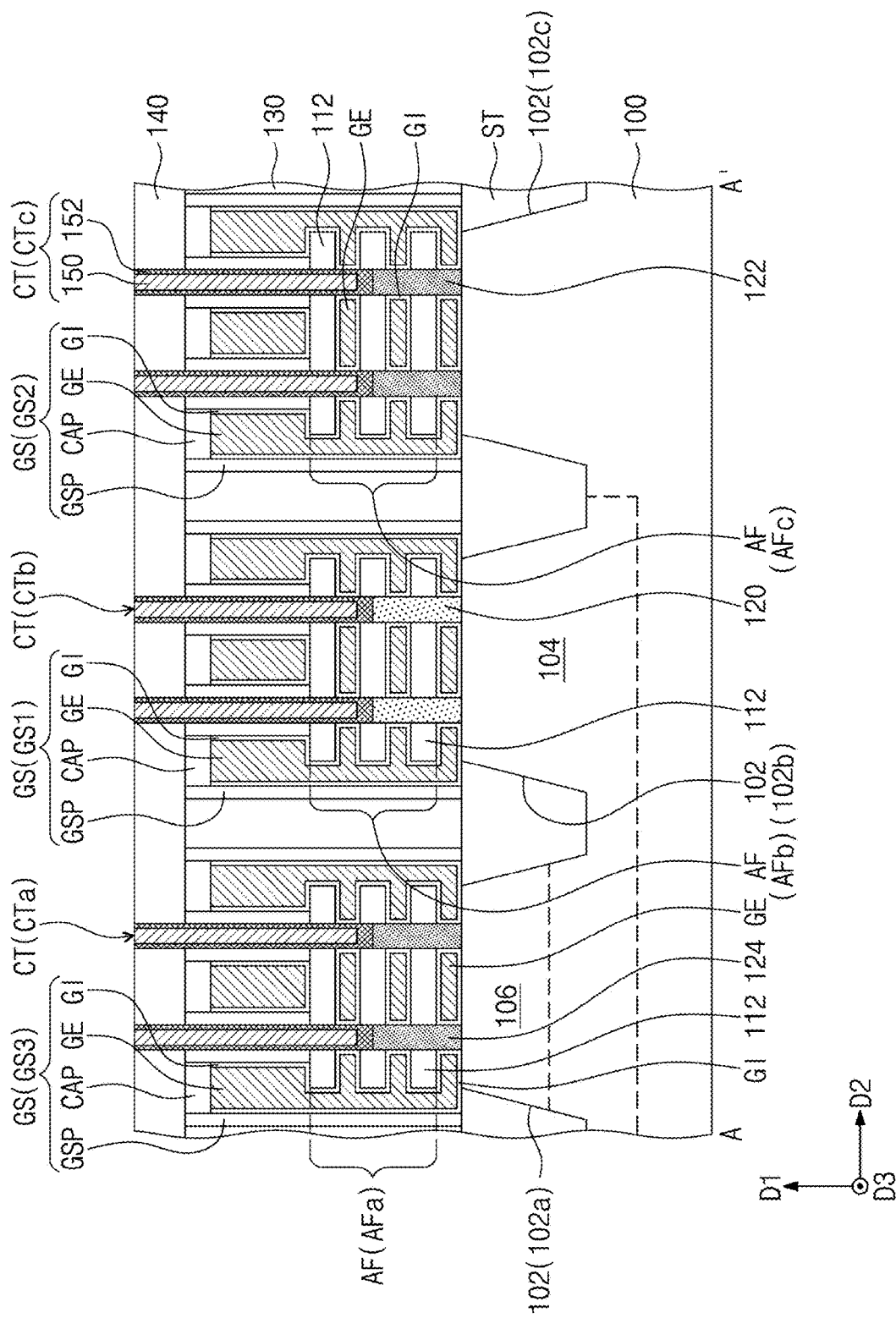
FIGS. 23A and 23B illustrate cross-sectional views taken along lines A-A' and B-B' of FIG. 17, respectively, showing a semiconductor device according to some example embodiments of inventive concepts.
Figure 23B:
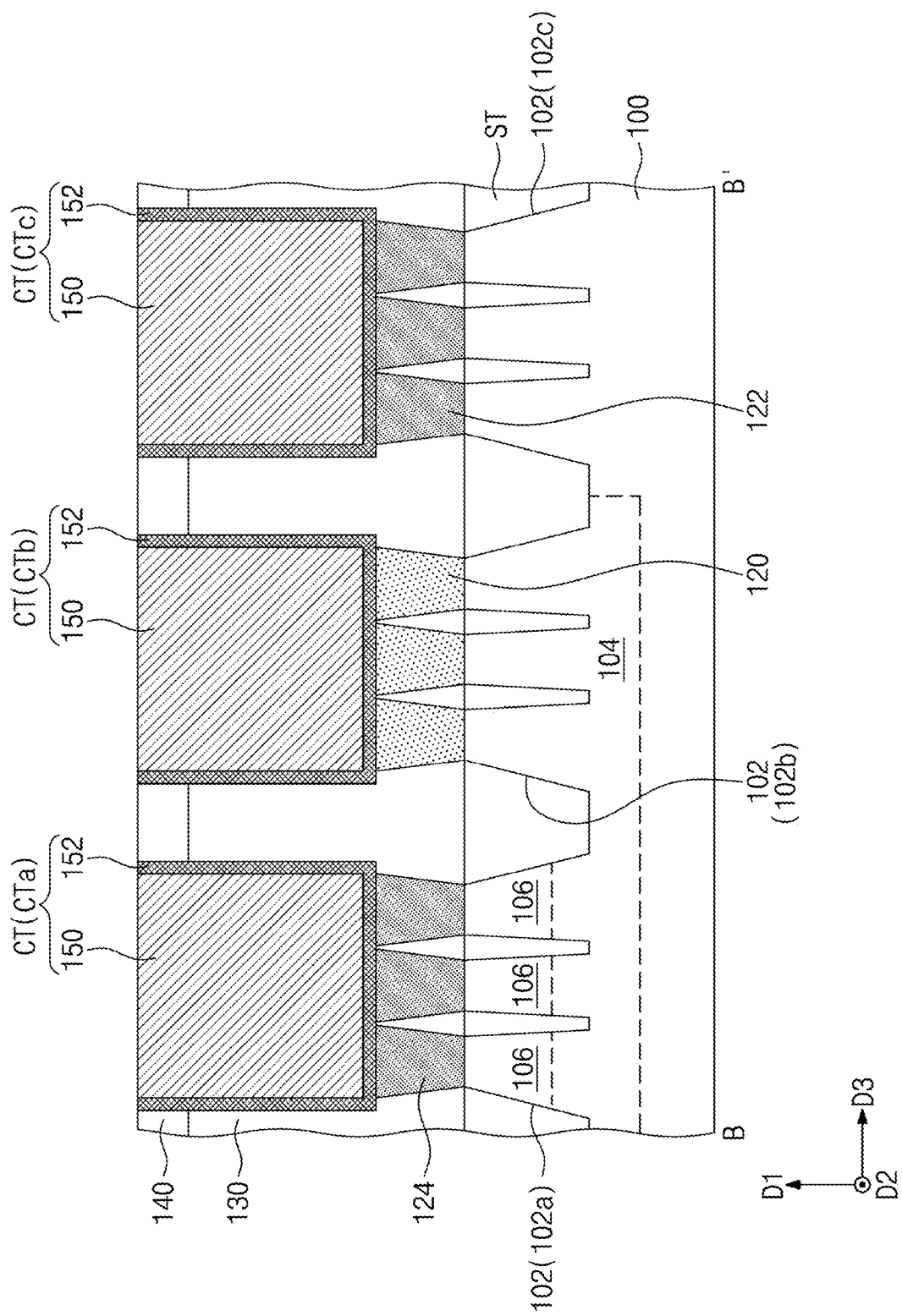

FIGS. 23A and 23B illustrate cross-sectional views taken along lines A-A' and B-B' of FIG. 17, respectively, showing a semiconductor device according to some example embodiments of inventive concepts. The following semiconductor device is similar to that discussed with reference to FIGS. 1, 2A, and 2B, and thus only differences between the semiconductor devices will be described below in the interest of brevity of description.

Referring to FIGS. 17, 23A, and 23B, active fins AF may be disposed on corresponding active patterns 102. Each of the active fins AF may include the semiconductor patterns 112 that are spaced apart from each other along the first direction D1. The active fins AF may include a first active fin AFa on the first active pattern 102a, a second active fin AFb on the second active pattern 102b, and a third active fin AFc on the third active pattern 102c. In some example embodiments, a third connection pattern 124 may penetrate the semiconductor patterns 112 of the first active fin AFa and be connected to the impurity region 106. The third connection pattern 124 may be epitaxial patterns that are formed using the semiconductor patterns 112 of the first active fin AFa and the first active pattern 102a are used as seeds. The third connection pattern 124 may include one or more of silicon-germanium (SiGe), silicon (Si), or silicon carbide (SiC). The third connection pattern 124 may further include impurities having the first conductivity type.

The substrate 100 may be provided thereon with the gate structures GS that run across the active fins AF. In some example embodiments, the gate structures GS may further include third gate structures GS3 that run across the first active fin AFa. The third gate structures GS3 may be spaced apart from each other in the second direction D2 on the first active fin AFa. The gate electrode GE of each of the third gate structures GS3 may run across the first active fin AFa and cover lateral surfaces of the first active fin AFa. The gate electrode GE and the gate dielectric pattern GI of each of the third gate structures GS3 may extend between the semiconductor patterns 112 of the first active fin AFa and between the first active fin AFa and the first active pattern 102a. The semiconductor patterns 112 of the first active fin AFa may be spaced apart from the gate electrode GE across the gate dielectric pattern GI. In some example embodiments, the gate dielectric pattern GI of each of the third gate structures GS3 may extend between the third connection pattern 124 and the gate electrode GE, and may contact the third connection pattern 124.

The first contact plug CTa may be interposed between the third gate structures GS3, and may penetrate the first active fin AFa and be connected to the third connection pattern 124. The first contact plug CTa may have lateral surfaces in contact with the gate spacers GSP of the third gate structures GS3. In some example embodiments, a plurality of first active patterns 102a may be arranged spaced apart from each other in the third direction D3, and a plurality of first active fins AFa may be correspondingly disposed on the plurality of first active patterns 102a. In this case, a plurality of third connection patterns 124 may correspondingly penetrate the plurality of first active fins AFa and be connected to the impurity region 106. The first contact plug CTa may extend in the third direction D3 between the third gate structures GS3 and be connected to the plurality of third connection patterns 124. Except for the difference mentioned above, the semiconductor device according the present embodiment may be the same as or substantially similar to that discussed with reference to FIGS. 1, 2B, and 9.

FIGS. 24A to 26A and 24B to 26B illustrate cross-sectional views taken along lines A-A' and B-B' of FIG. 17, respectively, showing a method of fabricating a semiconductor device according to some example embodiments of inventive concepts. The following method of fabricating a semiconductor device is similar to that discussed with reference to FIGS. 3A to 8A and 3B to 8B, and thus only differences between the methods will be described below in the interest of brevity of description.

Figure 24A:
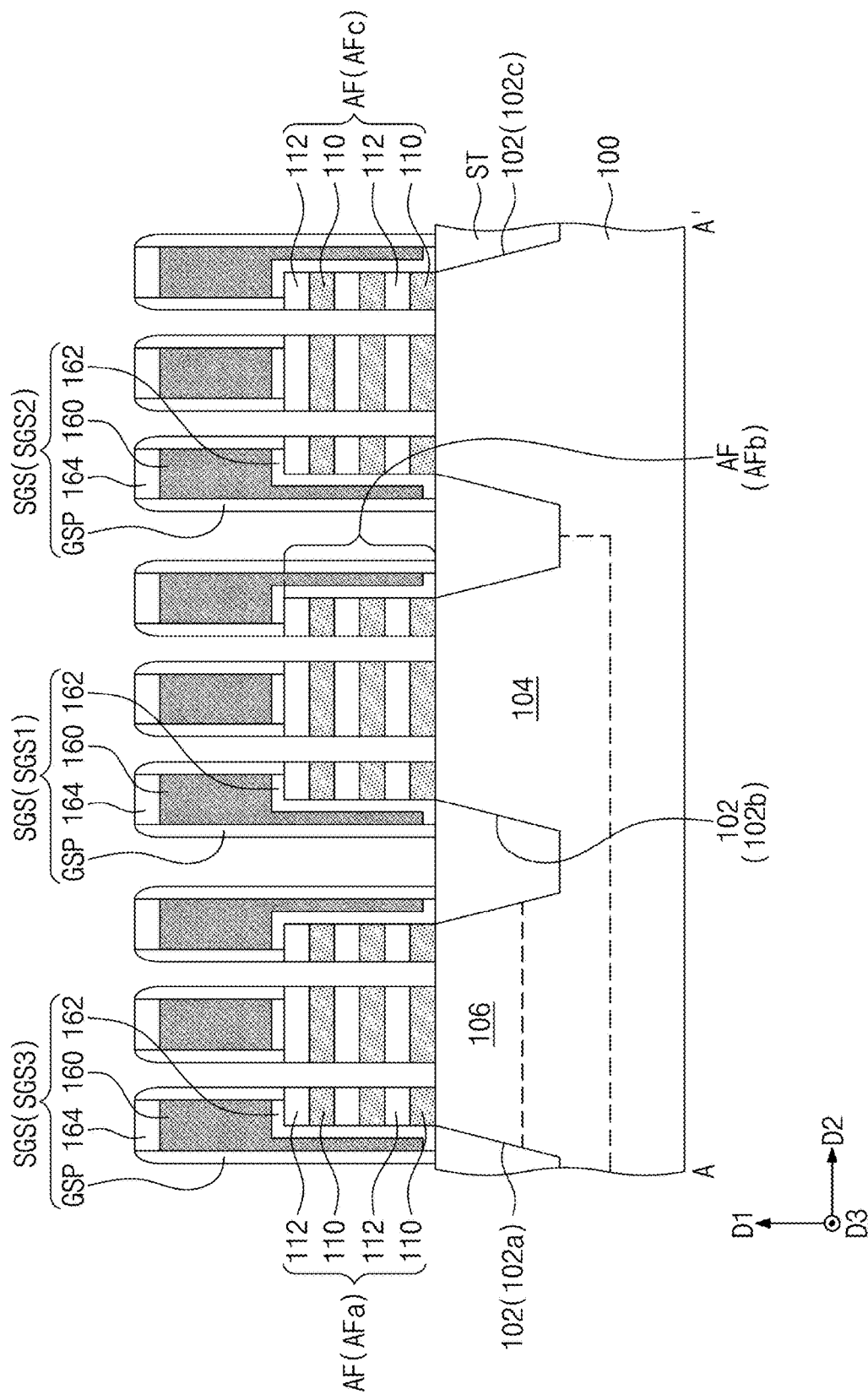
Figure 24B:
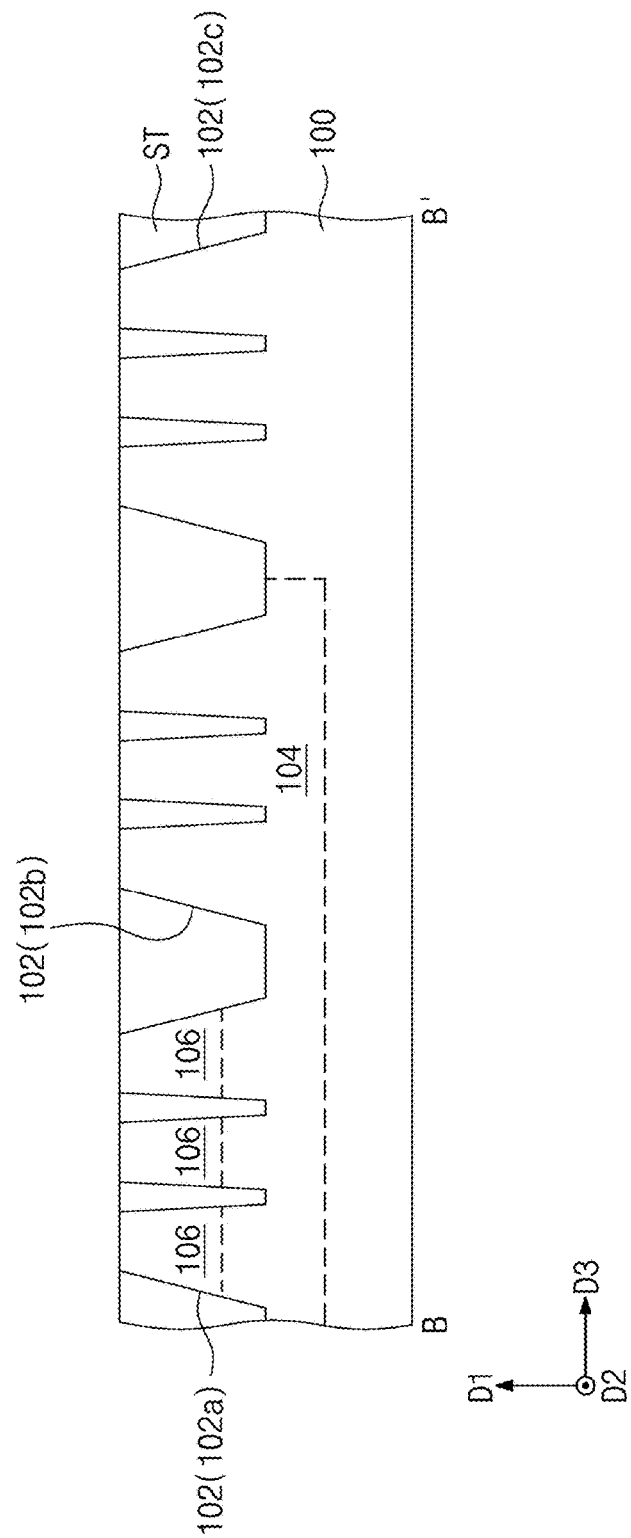

Referring to FIGS. 17, 24A, and 24B, on the substrate 100, sacrificial gate structures SGS may run across the active fins AF. In some example embodiments, the sacrificial gate structures SGS may include third sacrificial gate structures SGS3 that run across the first active fin AFa. The third sacrificial gate structures SGS3 may be spaced apart from each other in the second direction D2 on the first active fin AFa. The first active fin AFa may be partially removed between the third sacrificial gate structures SGS3, and thus lateral surfaces of the first active fin AFa and a top surface of the first active pattern 102a may be exposed between the third sacrificial gate structures SGS3.

Figure 25A:
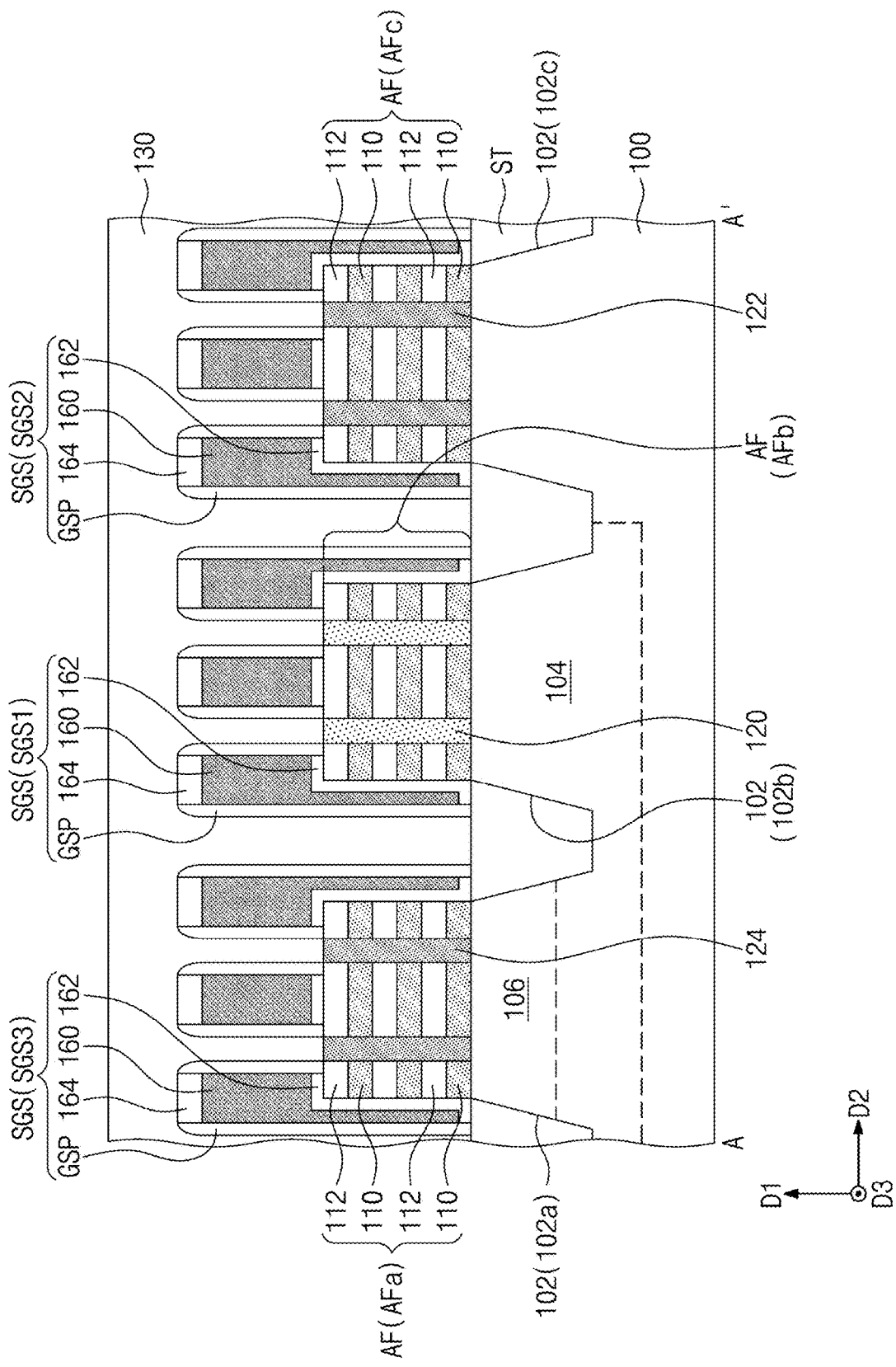
Figure 25B:
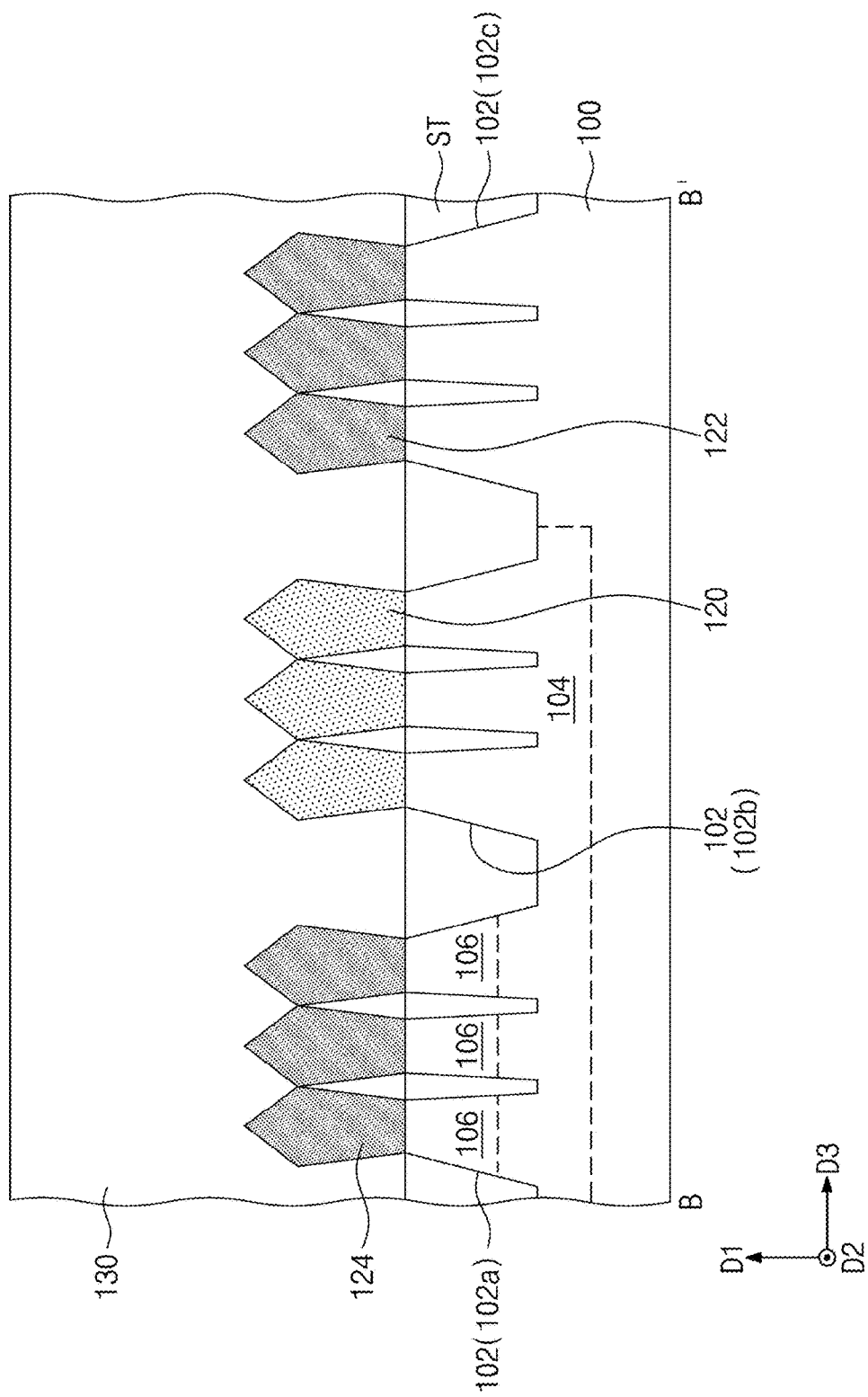

Referring to FIGS. 17, 25A, and 25B, a third connection pattern 124 may be formed on the first active pattern 102a between the third sacrificial gate structures SGS3. The third connection pattern 124 may contact lateral surfaces of the semiconductor patterns 112 of the first active fin AFa and be connected to the impurity region 106. Simultaneously with or after the selective epitaxial growth process, the formation of the third connection pattern 124 may further include implanting the third connection pattern 124 with impurities having the first conductivity type. On the substrate 100, the lower interlayer dielectric layer 130 may cover the active fins AF, the first, second, and third connection patterns 120, 122, and 124, and the sacrificial gate structures SGS.

Figure 26A:
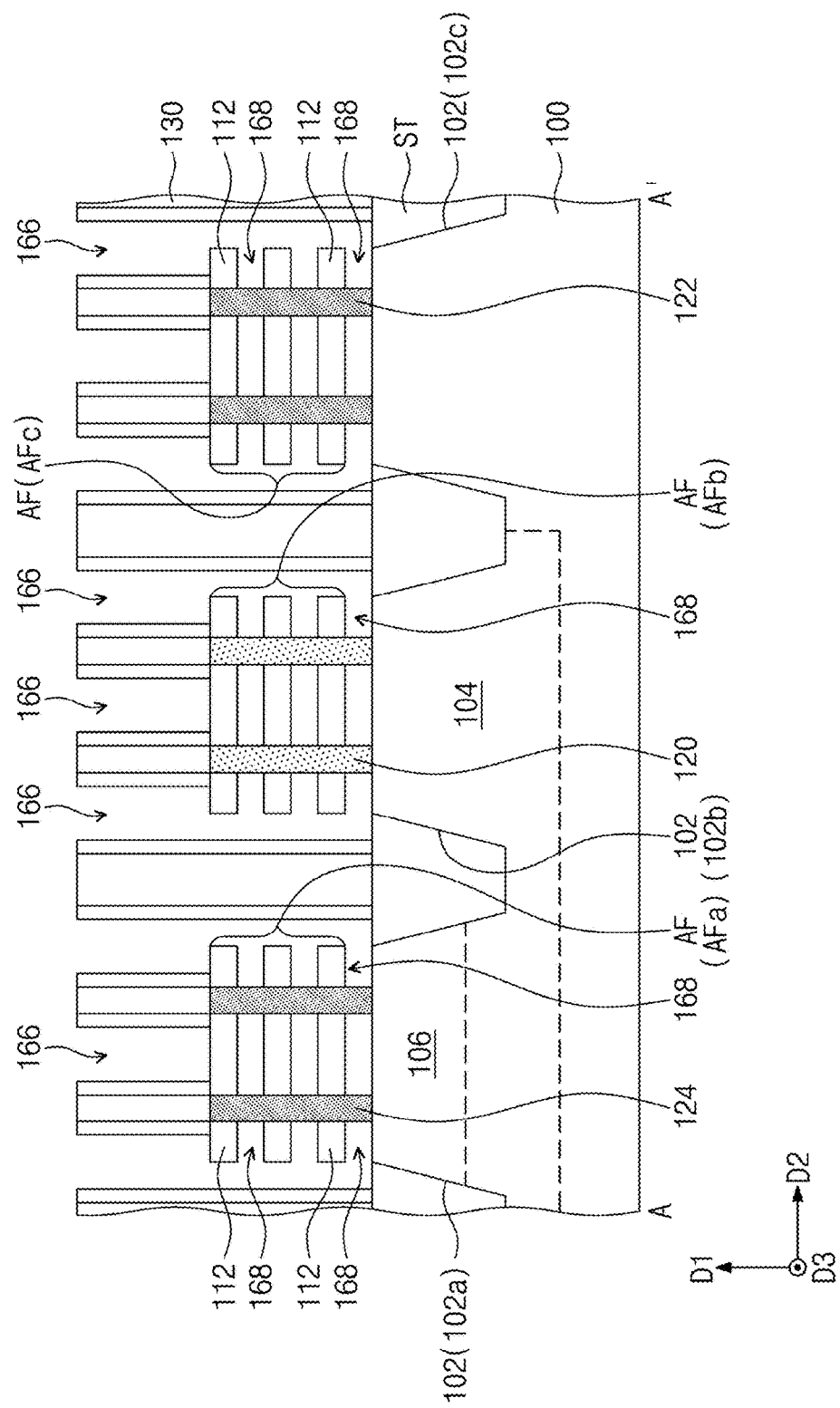
Figure 26B:
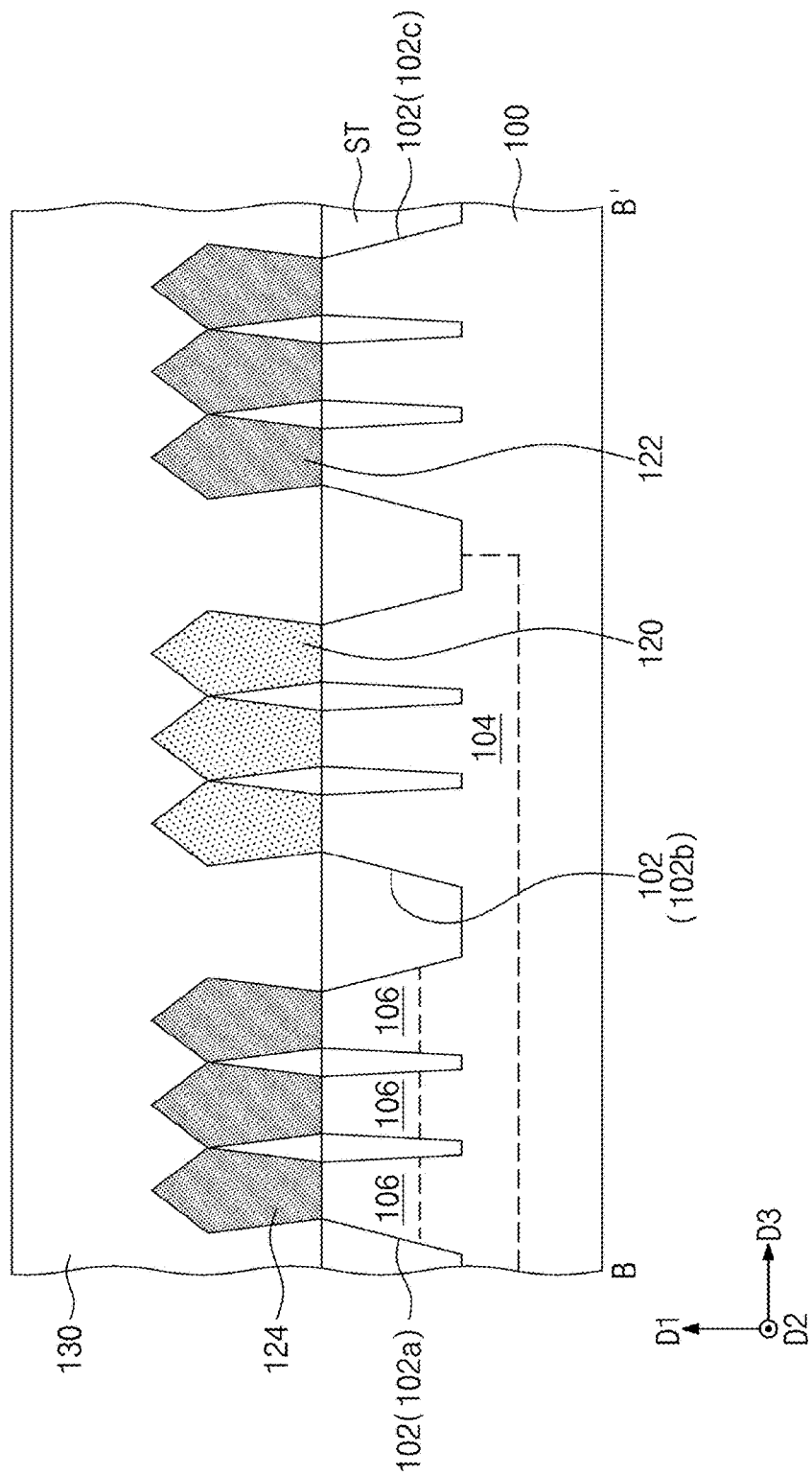

Referring to FIGS. 17, 26A, and 26B, the gap regions 166 may be formed in the lower interlayer dielectric layer 130. After the formation of the gap regions 166, the sacrificial patterns 110 which are exposed to the gap regions 166 may be selectively removed. Therefore, empty regions 168 may be formed between the semiconductor patterns 112 and between a lowermost one of the semiconductor patterns 112 and a corresponding one of the active patterns 102. Afterwards, as discussed with reference to FIGS. 1, 8A, and 8B, a gate dielectric pattern GI and a gate electrode GE may fill the gap regions 166 and the empty regions 168.

Figure 27A:
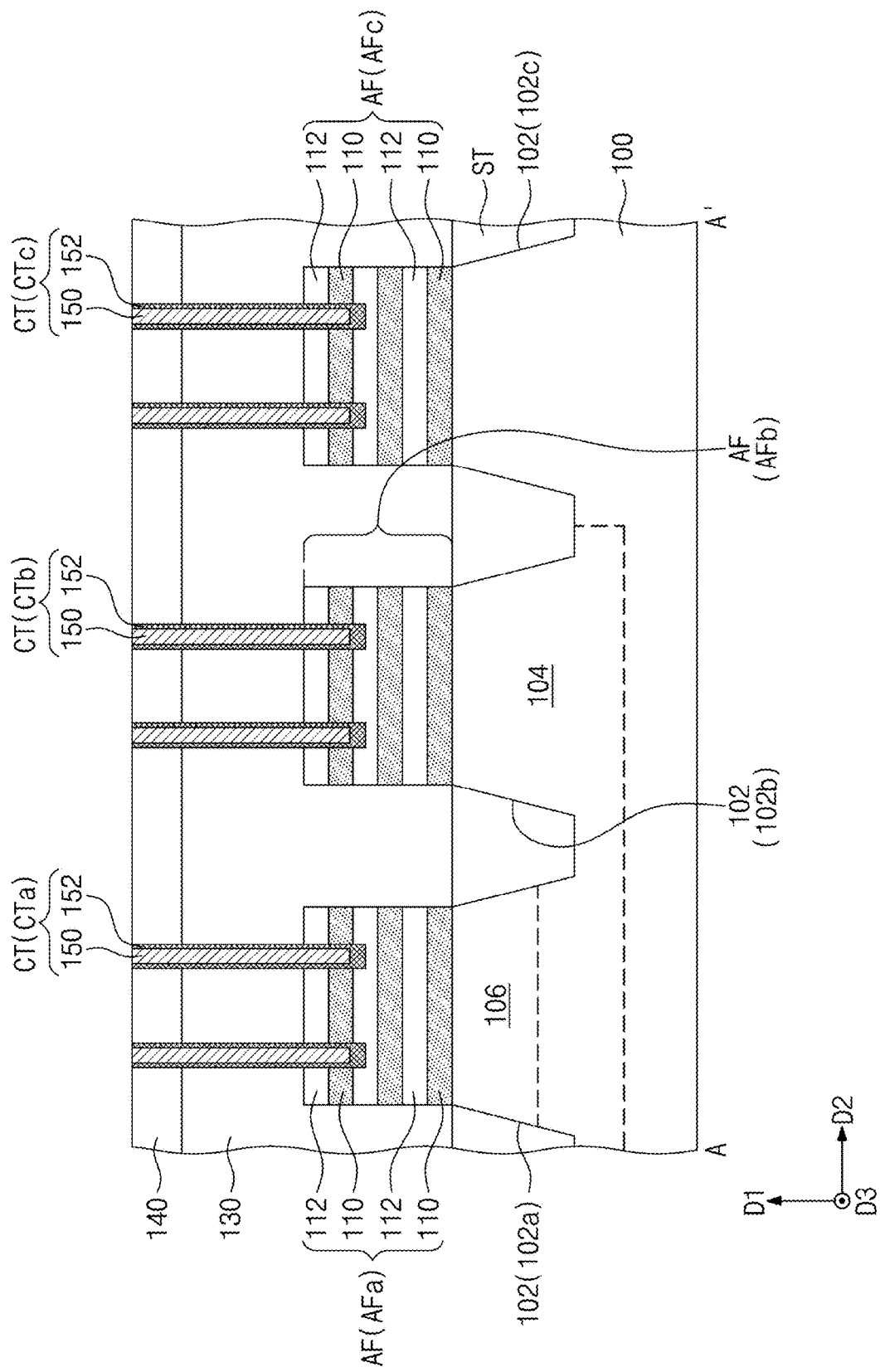

FIGS. 27A and 27B illustrate cross-sectional views taken along lines A-A' and B-B' of FIG. 1, respectively, showing a semiconductor device according to some example embodiments of inventive concepts. The following semiconductor device is similar to that discussed with reference to FIGS. 1, 2A, and 2B, and thus only differences between the semiconductor devices will be described below in the interest of brevity of description.

Referring to FIGS. 1, 27A, and 27B, the active fins AF may include a first active fin AFa on the first active pattern 102a, a second active fin AFb on the second active pattern 102b, and a third active fin AFc on the third active pattern 102c. The semiconductor pattern 112 and the sacrificial patterns 110 of the first active fin AFa may include impurities having the first conductivity type. In some example embodiments, the semiconductor patterns 112 and the sacrificial patterns 110 of the second active fin AFb may include impurities having the second conductivity type. Further, the semiconductor patterns 112 and the sacrificial patterns 110 of the third active fin AFc may include impurities having the first conductivity type. The present embodiment may omit the formation of the first and second connection patterns 120 and 122 and the gate structures GS discussed with reference to FIGS. 1, 2A, and 2B.

The substrate 100 may be provided thereon with the lower interlayer dielectric layer 130 that covers the active fins AF. The upper interlayer dielectric layer 140 may be disposed on the lower interlayer dielectric layer 130. The lower interlayer dielectric layer 130 may be provided therein with the contact plugs CT that extend into the upper interlayer dielectric layer 140. The contact plugs CT may include a first contact plug CTa connected to the first active fin AFa, a second contact plug CTb connected to the second active fin AFb, and a third contact plug CTc connected to the third active fin AFc.

A plurality of first contact plugs CTa may be connected to the first active fin AFa, and the lower interlayer dielectric layer 130 may be interposed between the plurality of first contact plugs CTa and in contact with a top surface of the first active fin AFa. The plurality of first contact plugs CTa may have their lateral surfaces in contact with the lower interlayer dielectric layer 130. In some example embodiments, a plurality of first active patterns 102a may be arranged spaced apart from each other in the third direction D3, and a plurality of first active fins AFa may be correspondingly disposed on the plurality of first active patterns 102a. In this case, the first contact plug CTa may extend in the third direction D3 and be connected to the plurality of first active fins AFa. A plurality of second contact plugs CTb may be connected to the second active fin AFb, and the lower interlayer dielectric layer 130 may be interposed between the plurality of second contact plugs CTb and in contact with a top surface of the second active fin AFb. The plurality of second contact plugs CTb may have their lateral surfaces in contact with the lower interlayer dielectric layer 130. In some example embodiments, a plurality of second active patterns 102b may be arranged spaced apart from each other in the third direction D3, and a plurality of second active fins AFb may be correspondingly disposed on the plurality of second active patterns 102b. In this case, the second contact plug CTb may extend in the third direction D3 and be connected to the plurality of second active fins AFb. Further, a plurality of third contact plugs CTc may be connected to the third active fin AFc, and the lower interlayer dielectric layer 130 may be interposed between the plurality of third contact plugs CTc and in contact with the third active fin AFc. The plurality of third contact plugs CTc may have their lateral surfaces in contact with the lower interlayer dielectric layer 130. In some example embodiments, a plurality of third active patterns 102c may be arranged spaced apart from each other in the third direction D3, and a plurality of third active fins AFc may be correspondingly disposed on the plurality of third active patterns 102c. In this case, the third contact plug CTc may extend in the third direction D3 and be connected to the plurality of third active fins AFc.

According to inventive concepts, it may be possible to provide a vertical bipolar junction transistor whose structure is compatible to that of multi-bridge channel field effect transistors and to minimize junction leakage of the vertical bipolar junction transistor.

The aforementioned description provides some example embodiments for explaining some aspects of the inventive concepts. Therefore, the inventive concepts are not limited to the example embodiments described above, and it will be understood by one of ordinary skill in the art that variations in form and detail may be made therein without departing from the spirit and essential features of the inventive concepts.

What is claimed is:
1. A semiconductor device, comprising:
a well region in a substrate;
an impurity region in the well region;
a first active fin on the impurity region;
a second active fin on the well region;

a connection pattern penetrating the second active fin and connected to the well region;
a first contact plug on the connection pattern and between a plurality of gate structures, the first contact plug including an upper part and a lower part, the upper part protruding above the second active fin, the lower part protruding below the second active fin; and
the plurality of gate structures running across the second active fin, each of the gate structures including,
a gate electrode running across the second active fin, and
a plurality of gate spacers on lateral surfaces of the gate electrode,
wherein lateral surfaces of a portion of the upper part of the first contact plug are in direct contact with corresponding ones of the plurality of gate spacers, respectively, and lateral surfaces of the lower part of the first contact plug are in direct contact with the second active fin,
the substrate and the impurity region include impurities having a first conductivity type,
the well region includes impurities having a second conductivity type different from the first conductivity type,
the first active fin includes a plurality of first semiconductor patterns and a plurality of first sacrificial patterns that are alternately stacked in a direction perpendicular to a top surface of the substrate, and
the plurality of first semiconductor patterns and the plurality of first sacrificial patterns include impurities having the first conductivity type.

2. The semiconductor device of claim 1, wherein the connection pattern includes impurities having the second conductivity type.

3. The semiconductor device of claim 2, wherein
the second active fin includes a plurality of second semiconductor patterns that are spaced apart from each other in the direction perpendicular to the top surface of the substrate, and
the connection pattern penetrates the plurality of second semiconductor patterns and is connected to the well region.

4. The semiconductor device of claim 3, further comprising:
a plurality of second contact plugs connected to the first active fin; and an interlayer dielectric layer between the plurality of second contact plugs.

5. The semiconductor device of claim 4, wherein lateral surfaces of the plurality of second contact plugs are in contact with the interlayer dielectric layer.

6. The semiconductor device of claim 3, wherein
each of the plurality of first sacrificial patterns is between a corresponding pair of the plurality of first semiconductor patterns or between a lowermost one of the plurality of first semiconductor patterns and the impurity region.

7. The semiconductor device of claim 6, wherein
the second active fin includes a plurality of second sacrificial patterns, each of the plurality of second sacrificial patterns being between a corresponding pair of the plurality of second semiconductor patterns or between a lowermost one of the plurality of second semiconductor patterns and the well region, and
the connection pattern penetrates the plurality of second sacrificial patterns and is connected to the well region.

8. The semiconductor device of claim 7, wherein
the plurality of first semiconductor patterns include a first material same as that of the plurality of second semiconductor patterns,
the plurality of first sacrificial patterns include a second material same as that of the plurality of second sacrificial patterns, and
the first material is different from the second material.

9. The semiconductor device of claim 6, wherein the plurality gate structures include
a gate structure
that extends between the plurality of second semiconductor patterns.

10. The semiconductor device of claim 1, further comprising:
a plurality of second contact plugs connected to the first active fin; and
an interlayer dielectric layer covering the first active fin and surrounding the plurality second contact plugs,
wherein the interlayer dielectric layer extends between the plurality of second contact plugs and contacts the first active fin.

11. The semiconductor device of claim 10, wherein
the first contact plug is between the plurality of gate structures, and
the interlayer dielectric layer surrounds the first contact plug and the plurality of gate structures.

12. The semiconductor device of claim 1, wherein
each of the plurality of first sacrificial patterns is between a corresponding pair of the plurality of first semiconductor patterns or between a lowermost one of the plurality of first semiconductor patterns and the impurity region, and
the plurality of first sacrificial patterns include a material different from that of the plurality of first semiconductor patterns.

13. A semiconductor device, comprising:
a well region in a substrate;
an impurity region in the well region;
a first active fin on the impurity region and including a plurality of first semiconductor patterns and a plurality of first sacrificial patterns, the plurality of first semiconductor patterns and the plurality of first sacrificial patterns being alternately stacked in a first direction perpendicular to a top surface of the substrate;
a second active fin on the well region and including a plurality of second semiconductor patterns and a plurality of second sacrificial patterns, the plurality of second semiconductor patterns and the plurality of second sacrificial patterns being alternately stacked the first direction;
a third active fin on the substrate and including a plurality of third semiconductor patterns, the plurality of third semiconductor patterns being spaced apart from each other in the first direction;
a first connection pattern penetrating the second active fin and connected to the well region;
a first contact plug on the first connection pattern, the first contact plug including an upper part and a lower part, the upper part protruding above the second active fin, the lower part protruding below the second active fin; and
a second connection pattern penetrating the third active fin and connected to the substrate, wherein
lateral surfaces of the lower part of the first contact plug and lateral surfaces of the first connection pattern are in direct contact with the plurality of second semiconductor patters and the plurality of second sacrificial patters, the substrate, the impurity region, the plurality of first semiconductor patterns, and the plurality of first sacrificial patterns include impurities having a first conductivity type, and the well region includes impurities having a second conductivity type different from the first conductivity type.

14. The semiconductor device of claim 13, wherein the first connection pattern includes impurities having the second conductivity type, and the second connection pattern includes impurities having the first conductivity type.

15. The semiconductor device of claim 13, wherein each of the plurality of first sacrificial patterns is between a corresponding pair of the plurality of first semiconductor patterns or between a lowermost one of the plurality of first semiconductor patterns and the impurity region, and the plurality of first sacrificial patterns include a material different from that of the plurality of first semiconductor patterns.

16. The semiconductor device of claim 15, further comprising:

a plurality of second contact plugs connected to the first active fin; and an interlayer dielectric layer covering the first active fin and surrounding the plurality of second contact plugs, wherein the interlayer dielectric layer extends between the plurality of second contact plugs and contacts the first active fin.

17. The semiconductor device of claim 16, further comprising:

a plurality of first gate structures on the second active fin, wherein the upper part of the first contact plug is between the plurality of first gate structures.

18. The semiconductor device of claim 16, further comprising:

a third contact plug connected to the second connection pattern; and a plurality of second gate structures on the third active fin, wherein the third contact plug is between the plurality of second gate structures.

19. The semiconductor device of claim 18, wherein each of the plurality of second gate structures includes, a second gate electrode, and a plurality of second gate spacers on opposite lateral surfaces of the second gate electrode, and the third contact plug is in contact with corresponding ones of the plurality of second gate spacers of the plurality of second gate structures.

20. A semiconductor device, comprising:

a well region in a substrate;

an impurity region in the well region;

a first active fin on the impurity region, the first active fin including a plurality of first semiconductor patterns and a plurality of first sacrificial patterns that are alternately stacked in a first direction perpendicular to a top surface of the substrate;

a second active fin on the well region and including a plurality of second semiconductor patterns and a plurality of second sacrificial patterns, the plurality of second semiconductor patterns and the plurality of second sacrificial patterns being alternately stacked in the first direction;

a connection pattern penetrating the second active fin and connected to the well region;

a plurality of first contact plugs on the first active fin;

a second contact plug on the connection pattern, the second contact plug including an upper part and a lower part, the upper part protruding above the second active fin, the lower part protruding below the second active fin; and an interlayer dielectric layer covering the first active fin and surrounding the plurality of first contact plugs, wherein lateral surfaces of the lower part of the second contact plug and lateral surfaces of the connection pattern are in direct contact with the plurality of second semiconductor patterns and the plurality of second sacrificial patterns, the substrate, the impurity region, the plurality of first semiconductor patterns, and the plurality of first sacrificial patterns include impurities having a first conductivity type, the well region includes impurities having a second conductivity type different from the first conductivity type, and the interlayer dielectric layer extends between the plurality of first contact plugs and contacts the first active fin.

* * * * *